(12) United States Patent
Miyashita et al.

(10) Patent No.: US 6,706,456 B2
(45) Date of Patent: Mar. 16, 2004

(54) METHOD OF DETERMINING EXPOSURE CONDITIONS, EXPOSURE METHOD, DEVICE MANUFACTURING METHOD, AND STORAGE MEDIUM

(75) Inventors: Kazuyuki Miyashita, Chuo-ku (JP); Takashi Mikuchi, Ageo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/407,434

(22) Filed: Apr. 7, 2003

(65) Prior Publication Data

US 2003/0170552 A1 Sep. 11, 2003

Related U.S. Application Data

(63) Continuation of application No. PCT/JP01/08765, filed on Oct. 4, 2001.

(30) Foreign Application Priority Data

Oct. 5, 2000 (JP) ........................................ 2000-306612

(51) Int. Cl.⁷ .............................. G03F 9/00; G03C 5/00
(52) U.S. Cl. ........................................................ 430/30
(58) Field of Search ............................................ 430/30

(56) References Cited

FOREIGN PATENT DOCUMENTS

| | | |
|---|---|---|
| JP | 11-008194 | 1/1999 |
| JP | 11-233434 | 8/1999 |
| JP | 11-325870 | 11/1999 |
| JP | 2000-124103 | 4/2000 |

*Primary Examiner*—Christopher G. Young
(74) *Attorney, Agent, or Firm*—Oblon, Spivak, McClelland, Maier & Neustadt, P.C.

(57) ABSTRACT

While changing a focus position and a dose amount on the image plane by respective amounts, a mark including a measurement pattern and a reference pattern is transferred sequentially onto a plurality of part areas arranged in a matrix on a wafer via the projection optical system. And after the wafer is developed, an image of each of the plurality of part areas on the wafer developed is picked up, and matching with a template is performed on the image datum of each part area. Because a feature which does not disappear even with having been overdosed and of which the positional relation with the measurement pattern is known is used as the reference pattern, template-matching can be readily performed on the image datum of each part area by using the reference pattern as a reference, and an exposure condition under consideration (the best focus position) is determined based on the matching results, objective and quantitative, for the part areas (steps 237 through 249).

52 Claims, 18 Drawing Sheets

*Fig. 11*

| | | | | | | | | | | | | | | | | | | | | |
|---|---|---|---|---|---|---|---|---|---|---|---|---|---|---|---|---|---|---|---|---|
|1|0|1|1|1|1|1|1|1|1|0|0|0|0|0|0|1|1|1|1|1|1|
|1|0|1|1|1|1|1|1|1|1|1|1|1|1|1|1|1|1|1|1|1|1|
|2|0|0|1|1|1|1|1|1|1|1|1|1|1|1|1|1|1|1|1|1|1|
|5|0|0|0|0|0|1|1|1|1|0|0|0|0|0|0|1|1|1|1|1|1|
|7|0|0|0|0|0|0|0|1|1|1|1|1|1|1|1|1|1|1|1|1|1|
|9|0|0|0|0|0|0|0|0|0|1|1|1|1|1|1|1|1|1|1|1|1|
|11|0|0|0|0|0|0|0|0|0|0|0|1|1|1|1|1|1|1|1|1|1|
|9|0|0|0|0|0|0|0|0|0|1|1|1|1|1|1|1|1|1|1|1|1|
|7|0|0|0|0|0|0|0|1|1|1|1|1|1|1|1|1|1|1|1|1|1|
|5|0|0|0|0|0|1|1|1|1|1|1|1|1|1|1|1|1|1|1|1|1|
|2|0|0|1|1|1|1|1|1|1|1|1|1|1|1|1|1|1|1|1|1|1|
|1|0|1|1|1|1|1|1|1|1|1|1|1|1|1|1|1|1|1|1|1|1|
|1|0|1|1|1|1|1|1|1|1|1|1|1|1|1|1|1|1|1|1|1|1|

METHOD OF DETERMINING EXPOSURE CONDITIONS, EXPOSURE METHOD, DEVICE MANUFACTURING METHOD, AND STORAGE MEDIUM

CROSS-REFERENCE TO RELATED APPLICATIONS

This is a continuation of International Application PCT/JP01/08765, with an international filing date of Oct. 4, 2001, the entire content of which being hereby incorporated herein by reference, which was not published in English.

BACKGROUND OF THE INVENTION

1. Field of the Invention

The present invention relates to a method of determining exposure conditions, an exposure method, a device manufacturing method, and a storage medium, and more specifically to a method of determining exposure conditions in transferring a pattern formed on a mask onto a substrate, an exposure method that exposes under the exposure conditions determined by the determining method, a device manufacturing method that uses the exposure method, and a storage medium that stores the program of determining exposure conditions.

2. Description of the Related Art

To date, in a lithography process for manufacturing semiconductor devices, liquid crystal display devices, or the like, exposure apparatuses have been used which transfer a pattern formed on a mask or reticle (generically referred to as a "reticle" hereinafter) onto a substrate such as a wafer or glass plate (hereinafter, referred to as a "wafer" as needed) coated with a resist, through a projection optical system. As such exposure apparatuses, a reducing projection exposure apparatus of a step-and-repeat type (so-called stepper) and a successive-movement-type exposure apparatus such as a scanning exposure apparatus of a step-and-scan type, that is an improvement on the stepper, are used mainly from the point of view of throughput.

In exposure by such an exposure apparatus, it is known that depending on the energy amount (exposure dose amount) of exposure light irradiating an exposure area on a wafer and the positional relationship between the image plane for a reticle pattern to be transferred onto and the exposure area on the wafer during exposure, that is, a focus error for the exposure area on the wafer, the shapes of the pattern's features transferred onto the wafer vary. If the exposure dose amount is less than a desired one, the exposure of the exposure area on the wafer is not sufficient, and if the exposure dose amount is too much, the neighborhood of the exposure area is also exposed. Further, when the position of the exposure area on the wafer in the direction parallel to the projection optical system's optical axis is not within the depth of focus of the projection optical system's image plane for the reticle pattern, that is, when a focus error exists, an image of the reticle pattern formed in the exposure area on the wafer is blurred, so that an accurate, reduced image of the pattern cannot be formed on the wafer. Therefore, in order to project an accurate, reduced image of the pattern onto a wafer, the exposure dose amount and the position of the wafer in the optical axis direction (hereinafter, called "focus position" as needed) need be optimized.

Moreover, as semiconductor devices (integrated circuits), etc., become more highly integrated year by year, higher resolution, that is, the capability of accurately transferring more detailed dimension features is demanded of projection exposure apparatuses, which are an apparatus for manufacturing semiconductor devices, etc. In order to improve the resolution of a projection exposure apparatus, the projection optical system thereof need be improved in imaging performance, and hence, it is important to accurately measure and evaluate the imaging characteristics of the projection optical system.

In order to accurately measure an imaging characteristic, e.g. the image surface (best imaging surface), of the projection optical system, the best focus position at each measurement point must be accurately measured.

As the method of detecting the above-mentioned optimum exposure conditions and the best focus position simultaneously, a method is known which transfers a predetermined reticle pattern (for example a line-and-space pattern, etc.) as a test pattern onto a test wafer a number of times each time with a different exposure dose amount and with the wafer being at a different focus position, and which views resist images (transferred images of the pattern) obtained through the development of the test wafer by means of a scanning electron microscope (SEM) and determines the forming states thereof. That is, the exposure dose amount and the wafer's position in the projection optical system's optical axis direction under which a resist image has been formed whose forming state is determined to be best by the viewing are determined to be the best exposure dose amount and the best focus position respectively. Alternatively, viewing to check for each field whether or not a transferred pattern exists, the middle point of the exposure dose amount range and the middle point of the wafer's focus position range for which a transferred pattern is determined to exist are determined to be the best exposure dose amount and the best focus position respectively.

In the above prior art method of determining exposure conditions, however, because of viewing to check results of the test exposure, if values of each of the conditions for the test exposure vary coarsely, it is easy to find a pattern in the best forming state in the test exposure wafer or check whether or not a transferred pattern exists in a field, but it is difficult to accurately obtain the best exposure conditions. Meanwhile, if values of each of the conditions for the test exposure vary finely, the time for the exposures of all fields increases, and the number of candidates for a pattern formed in the best exposure conditions is expected to increase, or it is difficult to determine the boundary between fields where a transferred pattern exists and fields where a transferred pattern does not. Hence, it is difficult to determine the best exposure conditions accurately.

Under such circumstances, an invention for solving such difficulty of the above-mentioned method of determining exposure conditions by viewing is disclosed in, for example, Japanese Patent Laid-Open No. 11-233434, where after development of a wafer on which a pattern has been transferred in test exposure, the images of the pattern's resist images developed are picked up, and where pattern matching with a given template is performed on the image data to determine the best exposure conditions based on results of the pattern matching.

Since the invention was made, patterns have become finer in dimension, and when such a pattern is used as the test pattern, depending on the type of template pattern, performing simply pattern matching may take a long time for determining the exposure conditions to increase greatly, and it may be difficult to determine the real, best exposure conditions. Further, while correlation coefficients obtained by the pattern matching are usually compared with a given threshold value, it needs a skill to set the threshold value to an appropriate value. There is much room for improvement therein.

SUMMARY OF THE INVENTION

This invention was made under such circumstances, and a first purpose of the present invention is to provide a method of determining exposure conditions, which method can accurately obtain the best exposure conditions.

Further, a second purpose of the present invention is to provide an exposure method that can exactly perform very accurate exposure under the best exposure conditions.

Yet further, a third purpose of the present invention is to provide a device manufacturing method that can manufacture highly integrated devices with good productivity.

Still further, a fourth purpose of the present invention is to provide a program that automates the process in an exposure apparatus of determining exposure conditions and a storage medium that stores the program.

According to a first aspect of the present invention, there is provided a first exposure condition determining method with which to determine exposure conditions for transferring a pattern arranged on a first plane onto an object arranged on a second plane via a projection optical system, the method comprising the steps of transferring a test exposure pattern including a predetermined measurement pattern and a reference pattern sequentially onto a plurality of part areas on the object via the projection optical system while changing at least one of exposure conditions under consideration, the reference pattern being formed on the object having a photosensitive layer on its surface to be thicker in line width than the measurement pattern; picking up an image of the plurality of part areas on the object on each of which the test exposure pattern has been transferred under the exposure conditions of different values and performing pattern-matching with template pattern data on the image datum of each part area, the template pattern data including image data corresponding to the reference pattern; and determining the at least one exposure condition under consideration based on results of the pattern-matching for the part areas.

Herein, the term "exposure conditions" refers not only to exposure conditions in the narrow sense such as illumination conditions (including the type of mask) and an exposure dose amount on the image plane, but also to exposure conditions in the broad sense including settings for all components related to exposure such as imaging characteristics of the projection optical system.

According to this, a first step transfers a test exposure pattern including a predetermined measurement pattern and a reference pattern sequentially onto a plurality of part areas on the object via the projection optical system while changing at least one of exposure conditions under consideration, the reference pattern being formed on the object having a photosensitive layer on its surface to be thicker in line width than the measurement pattern, the reference pattern being formed on the object having a photosensitive layer on its surface to be thicker in line width than the measurement pattern. As a result, the test exposure pattern including the predetermined measurement pattern and the reference pattern has been transferred on each of the plurality of part areas on the object by a test exposure under the at least one exposure condition of a different value.

A second step picks up an image of the plurality of part areas on the object on each of which the test exposure pattern has been transferred under the exposure conditions of different values and performing pattern-matching with template pattern data on the image datum of each part area, the template pattern data including image data corresponding to the reference pattern. In this case, because a feature whose image is formed on an object having a photosensitive layer on its surface to be thicker in line width than the measurement pattern's is used as the reference pattern, it does not disappear for example even when the exposure energy amount is so large that the measurement pattern's image disappears (overdose). Here, the phrase "reference pattern being formed on the object having a photosensitive layer on its surface to be thicker in line width than the measurement pattern" includes the case where, when the reference pattern is formed on a mask, the line width of the reference pattern is physically thicker than that of the measurement pattern on the mask, so that its transferred image is thicker in line width than the measurement pattern's on an object, and the case where, in determining exposure conditions, the reference pattern's transferred image is formed, while the measurement pattern's transferred image is not formed, in the photosensitive layer on the object's surface at an exposure energy amount in the range in which it is variable. That is, the phrase "to be thicker in line width" includes one existing with the other not existing as well as literally being thicker. Therefore, the reference pattern is not limited to a line-like mask feature with a line width, but is any feature in shape whose transferred image is formed in the photosensitive layer and can be used as a reference. Hence, the reference pattern may be constituted by boundary lines between measurement patterns on a mask.

Further, because the positional relationship between the reference pattern and the measurement pattern is known, by comparing data of the reference pattern's transferred image in each image data and image data corresponding to the reference pattern in the template pattern data, image data of the transferred image formed in each of the part areas on the object can be matched with the template pattern data, and thereby the degree of matching (correlation between the two) is obtained for each part area and the time required for template matching is shortened. In this case, by using not a subjective method such as viewing but pattern matching that is an objective, quantitative method, the state of the pattern's transferred image for each part area is obtained.

And a third step determines the at least one exposure condition under consideration based on results of the pattern-matching for the part areas.

Therefore, according to the first exposure condition determining method, the exposure condition under consideration can be obtained stably, accurately, and quickly without making the test exposure conditions vary too finely.

In this case, in the transferring step the transfer may be performed while changing two exposure conditions under consideration; in the picking-up step, a respective correlation value between the template pattern data and the image datum of each the part area may be obtained as a result of the pattern-matching, and in the determining step, at least one of the exposure conditions under consideration may be determined based on a curve shape identified based on results of comparing the correlation values and a preset threshold value as a reference for identifying the curve shape on a two-dimensional coordinate system whose axes represent the two exposure conditions respectively. In this case, a respective correlation value (denoting the degree of matching) between the template pattern data and the image datum of each the part area is obtained by the pattern-matching, and a curve shape is identified based on results of comparing the correlation values and a preset threshold value as a reference for identifying the curve shape on a two-dimensional coordinate system whose axes represent the two exposure conditions respectively, which curve represents a boundary between correlation values above the threshold value and ones not above it in the distribution of the correlation values for the part areas, and at least one of the exposure conditions under consideration is determined based on the curve shape identified. Therefore, the exposure condition under consideration can be determined stably, accurately, and quickly.

In this case, the curve shape may be an approximate curve. In this case, a respective correlation value between the template pattern data and the image datum of each the part area is obtained by the pattern-matching, and a plurality of boundary points are obtained based on results of comparing the correlation values and a preset threshold value as a reference for calculating an approximate curve on a two-dimensional coordinate system whose axes represent the two exposure conditions respectively, and the approximate curve fitted close to the boundary points is calculated. And from a peak (or bottom) point, inflection point, or intersections with a given slice level of the calculated approximate curve, at least one of the exposure conditions under consideration can be determined.

In the first exposure condition determining method of this invention, when at least one of the exposure conditions under consideration is determined from the curve shape on the two-dimensional coordinate system, the plurality of part areas on the object may be arranged in a matrix on the object so as to form a rectangular area as a whole; the curve shape may be a shape including a mountain-like curve appearing in the rectangular area, and when picking up an image of the plurality of part areas, an image of part of the rectangular area may be picked up, in which part a mountain-like curve is, from experience, expected to exist.

In this case, an image of each of a plurality of divided areas that the target area whose image to be picked up may be divided into is picked up.

In the first exposure condition determining method of this invention, various data can be used as the template pattern data, such as pattern data calculated based on the test exposure pattern and the projection magnification of the projection optical system, or the template pattern data may be image data of at least one part area where an image of the measurement pattern does not substantially exist and which is selected from image data of the plurality of part areas on the object on which the test exposure pattern has been transferred in the transferring step. In this case, since image data of at least one part area where an image of the measurement pattern does not substantially exist (hereinafter called white pattern data, as needed) is selected as the template pattern data from image data of the part areas, the accuracy in detecting the boundary of whether the measurement pattern's transferred image exists and its neighborhood is high. Further, since the threshold value can be set high, false recognition hardly occurs, and it can achieve ideal detection of the pattern.

In the first exposure condition determining method of this invention, the template pattern data may be image data of at least one part area having a high possibility that a transferred, best-resolved image of the measurement pattern exists (hereinafter called black pattern data, as needed) and selected from image data of the plurality of part areas on the object on which the test exposure pattern has been transferred in the transferring step.

In this case, the first method may further comprise the step of performing before the determining step pattern-matching on the image datum of each part area with using as template pattern data image data of at least one part area where an image of the measurement pattern does not substantially exist and which is selected from image data of the plurality of part areas on the object on which the test exposure pattern has been transferred in the transferring step. In this case, pattern-matching the image datum of each part area with the white pattern data as the template pattern data accurately detects the boundary of whether the measurement pattern's transferred image exists. And based on the boundary line as the result, part areas having a high possibility that a transferred, best-resolved image of the measurement pattern exists are certainly detected, and image data (black pattern data) of any one of the part areas is used as the template pattern data, so that template pattern data meeting given requirements can be certainly selected.

In the first exposure condition determining method of this invention, when the photosensitive layer is made of a photo-resist, various features can be used as the reference pattern. For example, the reference pattern may have such a thickness that the resist image formed on the object through the development does not disappear. That is, the reference pattern's thickness is such that its resist image on the object does not disappear through development, taking into account the characteristics of the resist and exposure conditions.

In the first exposure condition determining method of this invention, the reference pattern may be such that the orientation of a transferred image of the measurement pattern can be detected from. In this case, even when transferred images on the object are rotated relative to a reference state, e.g. an initial state, image data of each transferred image can be quickly matched with template pattern data.

In this case, the reference pattern may be a frame-like pattern arranged around the measurement pattern and which is thick in line width.

In the first exposure condition determining method of this invention, the reference pattern may be such that the magnifying/reducing ratio, as well as the orientation, of a transferred image of the measurement pattern can be detected from its transferred image's data.

According to a second aspect of the present invention, there is provided a second exposure condition determining method with which to determine exposure conditions for transferring a pattern arranged on a first plane onto an object arranged on a second plane via a projection optical system, the method comprising the steps of transferring a measurement pattern sequentially onto a plurality of part areas on an object having a photosensitive layer on the surface thereof via the projection optical system while changing two exposure conditions under consideration; picking up an image of the plurality of part areas on the object on each of which the measurement pattern has been transferred under the exposure conditions of different values and selecting as a template pattern datum image data of at least one part area where an image of the measurement pattern does not substantially exist from the picked-up image data of the plurality of part areas; pattern-matching the image datum of each the part area with at least the selected template pattern datum to obtain a respective correlation value, and comparing the correlation values and a preset threshold value as a reference for calculating an approximate curve on a two-dimensional coordinate system whose axes represent the two exposure conditions under consideration respectively; and determining at least one of the exposure conditions under consideration based on an approximate curve calculated based on results of the comparing.

According to this, a first step transfers a measurement pattern sequentially onto a plurality of part areas on an object having a photosensitive layer on the surface thereof via the projection optical system while changing two exposure conditions under consideration. As a result, the measurement pattern's transferred image has been formed on each of the plurality of part areas on the object by a test exposure under the at least one exposure condition of a different value.

Next, a second step selects as a template pattern datum image data of at least one part area where an image of the measurement pattern does not substantially exist from picked-up image data of the plurality of part areas on the object on each of which the measurement pattern has been transferred under the exposure conditions of different values by the test exposure.

Next, a third step pattern-matches the image datum of each the part area with at least the selected template pattern datum to obtain a respective correlation value, and compares the correlation values and a preset threshold value as a reference for calculating an approximate curve on a two-dimensional coordinate system whose axes represent the two exposure conditions under consideration respectively, and calculates the approximate curve fitted close to a plurality of boundary points obtained based on the comparing results. Here, since white pattern data is selected as the template pattern data, the accuracy in detecting the boundary of whether the measurement pattern's transferred image exists and its neighborhood is high. Further, since the threshold value can be set high, false recognition hardly occurs, and it can achieve ideal detection of the pattern.

And a fourth step, from a peak (or bottom) point, inflection point, or intersections with a given slice level of the calculated approximate curve, determines at least one of the exposure conditions under consideration.

Therefore, the second exposure condition determining method of this invention can determine exposure conditions under consideration stably and accurately.

In this case, the threshold value may be determined based on a distribution of correlation values obtained beforehand by pattern-matching.

In this case, the distribution of correlation values may be a distribution obtained by normalizing correlation values of the part areas obtained by the pattern-matching.

When the template pattern data is white pattern data, it is difficult to determine an appropriate value as the threshold value, but according to this method, the threshold value can be determined easily and appropriately.

In the second exposure condition determining method of this invention, in the selecting step, image data of at least two part areas satisfying the condition each may be selected as the template datum, and when, in performing the pattern-matching step with using one of the selected template data, an approximate curve cannot be calculated, the pattern-matching step may be performed again using at least one of the rest of the selected template data.

According to a third aspect of the present invention, there is provided a third exposure condition determining method with which to determine exposure conditions for transferring a pattern arranged on a first plane onto an object arranged on a second plane via a projection optical system, the method comprising the steps of transferring a measurement pattern sequentially onto a plurality of part areas on an object having a photosensitive layer on the surface thereof via the projection optical system while changing two exposure conditions under consideration; picking up an image of the plurality of part areas on the object on each of which the measurement pattern has been transferred under the exposure conditions of different values and selecting as first template pattern data image data of at least one part area having a high possibility that a transferred, best-resolved image of the measurement pattern exists from the picked-up image data of the plurality of part areas; pattern-matching the image datum of each the part area with the selected first template pattern data to obtain a respective correlation value, and comparing the correlation values and a preset threshold value as a reference for calculating a curve shape on a two-dimensional coordinate system whose axes represent the two exposure conditions under consideration respectively; and determining at least one of the exposure conditions under consideration based on the curve shape calculated.

A first step transfers a measurement pattern sequentially onto a plurality of part areas on an object having a photosensitive layer on the surface thereof via the projection optical system while changing two exposure conditions under consideration. As a result, the measurement pattern has been transferred on each of the plurality of part areas on the object by a test exposure under the at least one exposure condition of a different value.

Next, a second step selects as first template pattern data image data of at least one part area having a high possibility that a transferred, best-resolved image of the measurement pattern exists from picked-up image data of the plurality of part areas on the object on each of which the measurement pattern has been transferred under the exposure conditions of different values by the test exposure.

Next, a third step pattern-matches the image datum of each the part area with the selected first template pattern data (black pattern data) to obtain a respective correlation value, and comparing the correlation values and a preset threshold value as a reference for calculating a curve shape on a two-dimensional coordinate system whose axes represent the two exposure conditions under consideration respectively, and calculates the curve shape based on the comparing results.

And a fourth step determines at least one of the exposure conditions under consideration based on the curve shape calculated.

Therefore, the third exposure condition determining method of this invention can determine exposure conditions under consideration stably and accurately without using viewing, which is subjective.

In this case, when the plurality of part areas on the object are arranged in a matrix on the object so as to form a rectangular area as a whole, the curve shape may be a shape including a mountain-like curve appearing in the rectangular area, and when picking up an image of the plurality of part areas, an image of part of the rectangular area may be picked up, in which part a mountain-like curve is, from experience, expected to exist.

In this case, an image of each of a plurality of divided areas that the target area whose image to be picked up is divided into may be picked up.

The third exposure condition determining method of this invention may further comprise the steps of selecting, before the selecting step, as second template pattern data image data of at least one part area where an image of the measurement pattern does not substantially exist from image data of the plurality of part areas; and pattern-matching the image datum of each the part area with at least the selected second template pattern data to obtain a respective correlation value, and comparing the correlation values and a preset threshold value as a reference for calculating a curve shape on a two-dimensional coordinate system whose axes represent the two exposure conditions under consideration respectively, the third method wherein in the step of selecting as first template pattern data, image data of at least one part area where a transferred, best-resolved image of the measurement pattern is, based on the curve shape obtained in the pattern-matching step, expected to exist is selected as the first template pattern data.

In this case, pattern-matching the image datum of each part area with the white pattern data as the second template pattern data accurately detects the boundary of whether the measurement pattern's transferred image exists. And based on the boundary line as the result, part areas having a high possibility that a transferred, best-resolved image of the measurement pattern exists are certainly detected, and image data of any one of the part areas is used as the first template pattern data, so that the first template pattern data meeting given requirements can be certainly selected.

In this case, when the plurality of part areas on the object are arranged in a matrix on the object so as to form a rectangular area as a whole, the selecting of the second template pattern data may be based on results of judging for part areas whether or not a transferred image of the measurement pattern exists in each of the part areas by obtaining the average of data in a predetermined detection window at each movement position, while sequentially moving the detection window in at least part of the rectangular area.

In the third exposure condition determining method of this invention, in the pattern-matching step, comparing the correlation values with a different one of a plurality of threshold values may be repeated, and the curve shape may be calculating for the different threshold value, and in the determining step, at least one of the exposure conditions under consideration may be determined based on at least two of the curve shapes each calculated for the respective threshold value.

In any one of the first through third exposure condition determining methods of this invention, a target for the picking-up may be a latent image formed in the photosensitive layer, or when the photosensitive layer is made of a photo-resist, a target for the picking-up may be a resist image obtained by developing the object. Here, the photosensitive layer is not limited to a photo-resist, but can be an optical record layer, photo-magnetic record layer, or the like, and an object having the photosensitive layer formed thereon is not limited to a wafer or a glass plate, but can be a substrate on which an optical record layer or photo-magnetic record layer can be formed.

In any one of the first through third exposure condition determining methods of this invention, various items are considered as the exposure conditions, and the exposure conditions under consideration may include at least one of position of the object in the optical axis direction of the projection optical system and the energy amount of an energy beam irradiating the object. In this case, at least one of the best focus position and the best exposure dose amount on the image plane can be determined stably and accurately without using viewing, which is subjective.

In any one of the first through third exposure condition determining methods of this invention, various patterns can be used as the measurement pattern. For example, the measurement pattern may include either of a line-and-space pattern having a duty ratio of 1/n, where n is not equal to zero, and a periodic pattern of contact holes, or may include either of an isolated line and an isolated contact hole. In the former case, a duty ratio with which the periodic pattern is viewed as isolated features is less than 1/3 for example.

In any one of the first through third exposure condition determining methods of this invention, when picking up an image of a plurality of part areas on the object, an image of part of the rectangular area may be picked up, in which part a peak point of the mountain-like curve or approximate curve is, from experience, expected to exist, but not being limited to this, image data of some part areas out of image data of the plurality of part areas may be used, or for some part areas such a correlation value may be calculated. In any case, the processing time can be shortened.

According to a fourth aspect of the present invention, there is provided a fourth exposure condition determining method with which to determine exposure conditions for transferring a pattern arranged on a first plane onto an object arranged on a second plane via a projection optical system, the method comprising the steps of transferring a measurement pattern sequentially onto a plurality of part areas on an object having a photosensitive layer on the surface thereof via the projection optical system while changing at least one of exposure conditions under consideration; acquiring a piece of information about the formation state of the pattern in each of the plurality of part areas on the object on each of which the measurement pattern has been transferred under the exposure conditions of different values; and comparing repeatedly the pieces of information about the formation states of the patterns in the part areas obtained in the acquiring step with a different one of a plurality of preset threshold values as references for calculating the one of the exposure conditions, and detecting a range of the threshold values in which values of the one of the exposure conditions under consideration calculated based on respective threshold values vary within a predetermined range and which range is continuous and not shorter than a predetermined length, and determining a best exposure condition based on the values for the threshold value range of the one of the exposure conditions under consideration.

According to this, a first step transfers a measurement pattern sequentially onto a plurality of part areas on an object having a photosensitive layer on the surface thereof via the projection optical system while changing at least one of exposure conditions under consideration. As a result, the measurement pattern has been transferred on each of the plurality of part areas on the object by a test exposure under the at least one exposure condition of a different value.

Next, a second step acquires a piece of information about the formation state of the pattern in each of the plurality of part areas on the object on each of which the measurement pattern has been transferred under the exposure conditions of different values. Here, the type of information about the formation state of a pattern depends on the method of detecting the part areas. That is, when picking up an image of a part area by light, the information is image data or data obtained by processing the image data, and when scanning a laser beam across the part area and detecting reflected or scattered beams, it is light-intensity signals or signals obtained by processing the light-intensity signals, and when illuminating the part area with laser beams slightly different in frequency and detecting the interference of diffracted beams from the part area (a so-called heterodyne detection method), it is position information or information obtained by processing the position information. Other detection methods produce respective types of information.

And a third step detects, when having repeated comparing the pieces of information about the formation states of the patterns in the part areas obtained in the acquiring step with a different one of a plurality of preset threshold values as references for calculating the one of the exposure conditions, a range of the threshold values in which values of the one of the exposure conditions under consideration calculated based on respective threshold values vary within a predetermined range and which range is continuous and not shorter than a predetermined length, and determines a best exposure condition based on the values of the one of the exposure conditions under consideration for the range. That is, after having repeated comparing the pieces of information about the formation states of the patterns in the part areas with a different one of the plurality of preset threshold values, detecting a range of the threshold values in which values of the one of the exposure conditions under consideration vary within a predetermined range and which range is continuous and not shorter than a predetermined length determines a best exposure condition easily and certainly, thereby solving the difficulty in determining a threshold value.

In this case, in the acquiring step, an image datum as a result of picking up each of the plurality of part areas on the object may be pattern-matched with a predetermined template pattern data to obtain a respective correlation value, and in the detecting step, comparing the correlation values and a different one of the threshold values may be repeated.

In this case, a target for the picking-up may be a latent image formed in the photosensitive layer, or when the photosensitive layer is made of a photo-resist, a target for the picking-up may be a resist image obtained by developing the object. Here, the photosensitive layer is not limited to a photo-resist, but can be an optical record layer, photo-magnetic record layer, or the like, and an object having the photosensitive layer formed thereon is not limited to a wafer or a glass plate, but can be a substrate on which an optical record layer or photo-magnetic record layer can be formed.

In the fourth exposure condition determining method of this invention, there are various techniques as the technique of determining a best exposure condition in the detecting step such as determining it as the value of the exposure condition corresponding to the middle of the detected range of threshold values. For example, in the detecting step, one of the average and weighted average of values of the one of the exposure conditions under consideration over the detected range may be determined to be a best exposure condition.

According to a fifth aspect of the present invention, there is provided an exposure method with which to transfer a pattern formed on a mask onto a substrate via a projection optical system by an exposure energy beam irradiating the mask, the exposure method comprising the steps of setting exposure conditions for exposure, taking into account exposure conditions under consideration determined according to any one of the first through fourth exposure condition determining methods of this invention; and transferring the pattern formed on the mask onto the substrate via the projection optical system under the set exposure conditions.

According to this, exposure conditions for exposure are set taking into account exposure conditions under consideration determined according to any one of the first through fourth exposure condition determining methods of this invention, and a pattern formed on a mask is transferred onto a substrate via the projection optical system by illuminating the mask with an exposure energy beam under the set exposure conditions, and thereby the fine dimension pattern can be accurately transferred onto the substrate.

Moreover, by using the exposure method of this invention in a lithography process, patterns can be accurately formed on a substrate, so that highly integrated micro-devices can be manufactured with high productivity and high yield. Therefore, according to another aspect of the present invention, there is provided a device manufacturing method using the exposure method of this invention.

Furthermore, any exposure condition determining method of this invention is performed by making the control computer of an exposure apparatus execute the procedures of transferring a measurement pattern sequentially onto a plurality of part areas on an object having a photosensitive layer on its surface via the projection optical system while changing at least one of exposure conditions under consideration; picking up an image of the respective images transferred on the plurality of part areas on the object each under the exposure condition of different values and performing pattern-matching with predetermined template pattern data on the respective image data of the part areas; and determining the at least one exposure condition under consideration based on results of the pattern-matching, thereby automating the determination of exposure conditions for the exposure apparatus. Therefore, according to still another aspect of the present invention, there is provided a program making a computer execute the procedures and a storage medium which stores the program and can be read by a computer.

It is noted that in automating the determination of exposure conditions, the alignment detecting system of an image processing type of the exposure apparatus can be used as an image pickup unit.

BRIEF DESCRIPTION OF THE DRAWINGS

FIG. 11 is a view showing an example of data obtained by producing a binary numeral result, in the form of a table;

FIGS. 12A and 12B are views for explaining function fitting of first and second stages respectively;

DESCRIPTION OF THE PREFERRED EMBODIMENTS

<<A First Embodiment>>

A first embodiment of the present invention will be described below with reference to FIGS. 1 to 12B.

Figure 1:
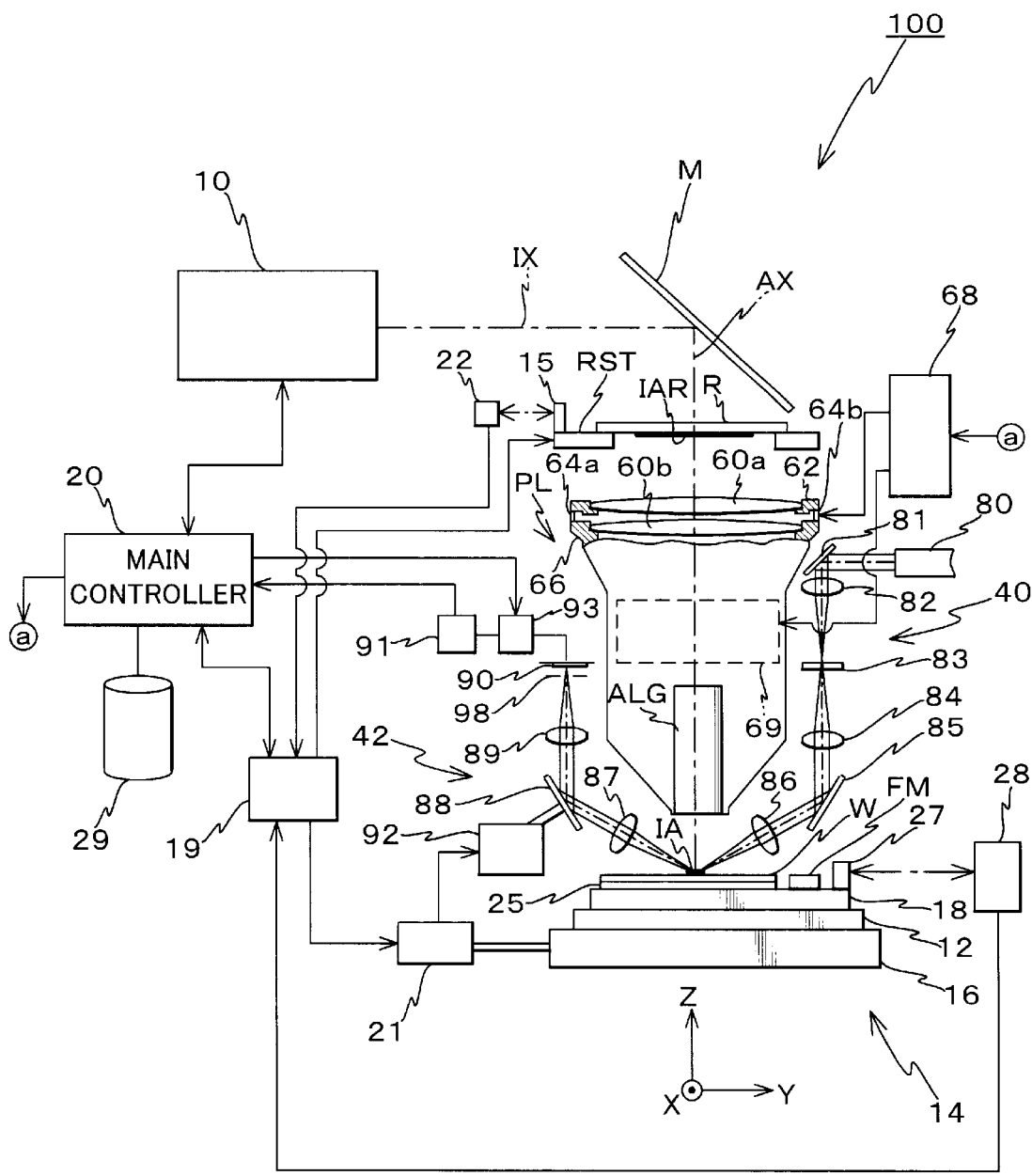
FIG. 1 is a schematic view showing the construction of an exposure apparatus according to a first embodiment of this invention.

FIG. 1 shows the schematic construction of an exposure apparatus 100 according to the first embodiment suitable to perform the invention's method of determining exposure conditions and the exposure method, which is a reducing projection exposure apparatus of a step-and-repeat type (so-called stepper).

This exposure apparatus 100 comprises an illumination system 10 for emitting exposure illumination light as an energy beam, a reticle stage RST for holding a reticle R as a mask, a projection optical system PL, a stage unit 14 having a substrate table 18 that moves XY-two-dimensionally on an XY plane holding a wafer W as a substrate, a control system for controlling these, and the like. This control system comprises a main controller 20, a storage unit 29, etc.

Figure 2:
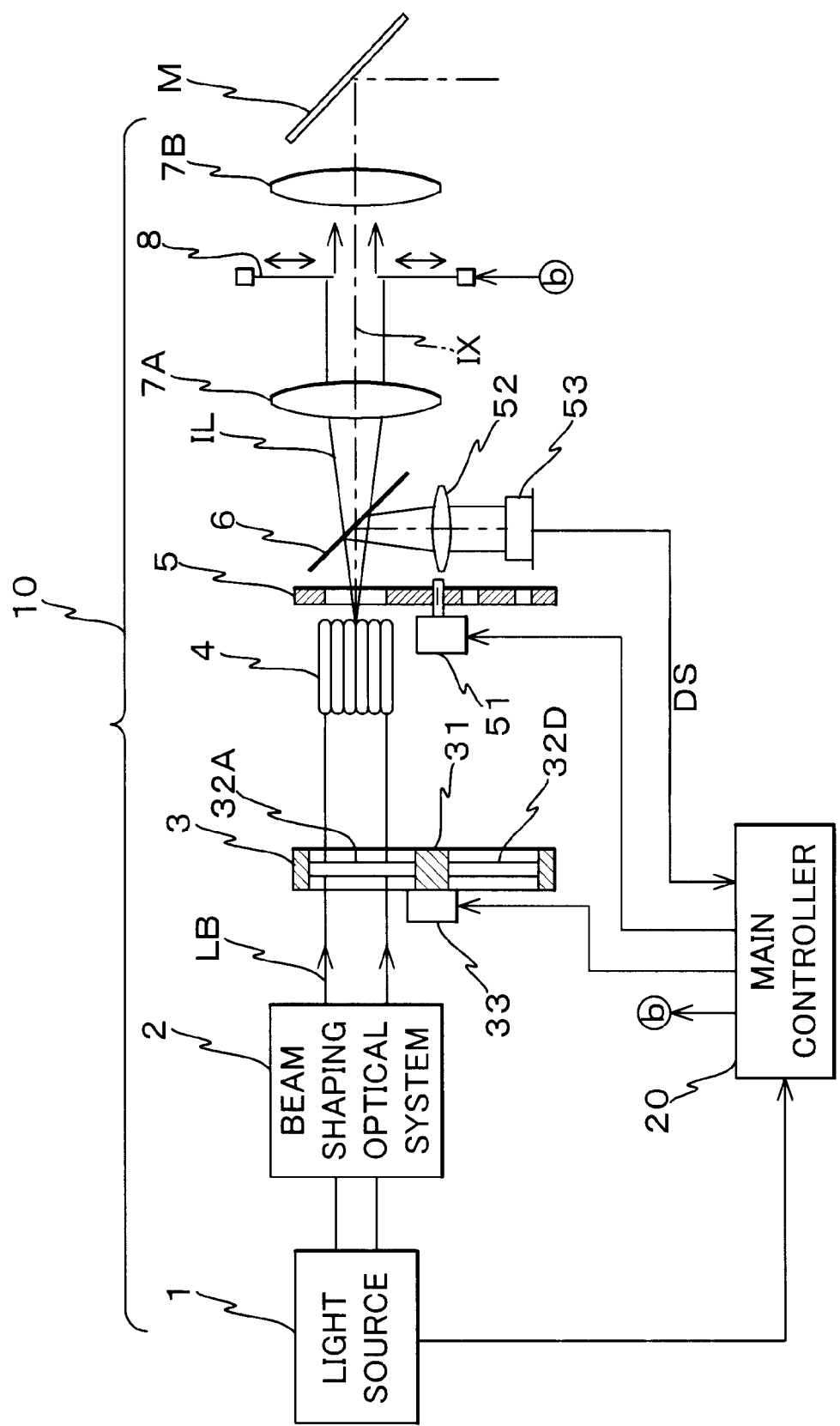
FIG. 2 is a view for explaining an example of the construction of the illumination system 10 of FIG. 1.

The illumination system 10, as shown in FIG. 2, comprises a light source 1, a beam-shaping optical system 2, an energy roughly-adjusting unit 3, a fly-eye lens 4 as an optical integrator, an illumination-system aperture stop plate 5, a beam splitter 6, a first relay lens 7A, a second relay lens 7B, a reticle blind 8, etc.

The above components of the illumination system 10 will be described below. The light source 1 is a KrF excimer laser (a wavelength of 248 nm), an ArF excimer laser (a wavelength of 193 nm), an $F_2$ laser (a wavelength of 157 nm) or the like, and is disposed, in practice, on the floor surface of a clean room where the exposure-apparatus main body is disposed or, e.g., in a service room having low cleanliness that is separate from the clean room, and is connected to the incidence end of the beam-shaping optical system via a guiding optical system (not shown). It is noted that the light source 1 may be a harmonic pulse generator such as a metal vapor laser or a YAG laser, or a super-high pressure mercury lamp.

The beam-shaping optical system 2 comprises, for example, a cylinder lens, beam expander, etc., (none are shown) for shaping the cross-section of a laser beam LB emitted in pulse from the light source 1 such that the laser beam LB is efficiently made incident on the fly-eye lens 4 behind it.

The energy roughly-adjusting unit 3 is disposed in the optical path of the laser beam LB behind the beam-shaping optical system 2, and comprises a rotational plate 31, on which a plurality of (e.g. 6) ND filters whose transmittances (=1−attenuation-rate) are different are arranged (only two ND filters 32A, 32D of them are shown in FIG. 2), and by rotating the rotational plate 31 by means of a driving motor 33 the transmittance to the laser beam LB can be changed from 100% by steps geometrically. The driving motor 33 is controlled by the main controller 20.

The fly-eye lens 4 is disposed in the optical path of the laser beam LB emitted from the energy roughly-adjusting unit 3, and forms a surface illuminant, a secondary illuminant, composed of a lot of point illuminants (illuminant images) in the focal plane on the exit side, for illuminating the reticle R with uniform illuminace. The laser beam emitted from the secondary illuminant is also called "pulse illumination light IL" hereinafter. It is noted that instead of the fly-eye lens 4, a rod-type (or inner-side-reflective-type) integrator or a diffracting optical device may be used as the optical integrator.

The illumination-system aperture stop plate 5 constituted by a disk-like member is disposed near the focal plane on the exit side of the fly-eye lens 4. And arranged at almost same angular pitches on the illumination-system aperture stop plate 5 are, e.g., a usual aperture stop (usual stop) constituted by a circular opening, an aperture stop (small-σ stop) for making coherence factor σ small which is constituted by a small, circular opening, a ring-like aperture stop (ring stop) for forming a ring of illumination light, and a deformation aperture stop for a deformation illuminant method composed of a plurality of openings disposed in an eccentric arrangement, of which two types of aperture stops are shown in FIG. 2. The illumination-system aperture stop plate 5 is constructed and arranged to be rotated by a driving unit 51, for example a motor, controlled by the main controller 20 so that one of the aperture stops is selectively set to be in the optical path of the pulse illumination light IL.

It is noted that instead of or in combination with the illumination-system aperture stop plate 5, an optical unit including at least one of a set of plural optical elements (e.g. diffractive optical elements), an optical element (e.g. conic prism or polyhedral prism) movable along the optical axis of the illumination optical system, and a zoom optical system may be arranged for example in between the light source 1 and the optical integrator 4.

Disposed in the optical path of the pulse illumination light IL emitted from the illumination-system aperture stop plate 5 is the beam splitter 6, whose reflectance is small and whose transmittance is large, and disposed in the optical path behind the beam splitter 6 are a relay optical system composed of the first and second relay lenses 7A, 7B, between which the reticle blind 8 is disposed.

The reticle blind 8 is disposed in a plane conjugate to the pattern surface of the reticle R, and consists of, e.g., two L-shaped movable blades or four movable blades arranged respectively above, below, left and right, which blades surround and form an aperture for defining an illumination area IAR on the reticle R, the area IAR being usually rectangular and slightly larger than the reticle R's pattern area. The aperture's shape can be set to be any rectangle by adjusting positions of the movable blades, which the main controller 20 controls via a blind driving unit (not shown) according to the shape of the reticle R's pattern area.

Disposed in the optical path of the pulse illumination light IL behind the second relay lens 7B forming part of the relay optical system is a deflecting mirror M for reflecting the pulse illumination light IL having passed through the second relay lens 7B toward the reticle R.

The operation of the illumination system 10 having the above construction will be described briefly in the following. The laser beam LB emitted in pulse from the light source 1 is made incident on the beam-shaping optical system 2, which shapes the cross section thereof so as to be made efficiently incident on the fly-eye lens 4 behind it, and then incident on the energy roughly-adjusting unit 3. The laser beam LB having passed through an ND filter of the energy roughly-adjusting unit 3 is made incident on the fly-eye lens 4. By this, the secondary illuminant (surface illuminant) is formed in the focal plane on the exit side of the fly-eye lens 4. The pulse illumination light IL emitted from the secondary illuminant passes through an aperture stop on the illumination-system aperture stop plate 5, and reaches the beam splitter 6, whose reflectance is small and whose transmittance is large. The pulse illumination light IL, as exposure light, having passed through the beam splitter 6 passes through the first relay lens 7A, the rectangular aperture of the reticle blind 8, and the second relay lens 7B in that order, and then is deflected vertically and toward below by the mirror M and, after passing through the condenser lens 32, illuminates the rectangular illumination area IAR on the reticle R held on the reticle stage RST with uniform illuminance.

Meanwhile, the portion of the pulse illumination light IL reflected by the beam splitter 6 is received through a collective lens 52 by a integrator sensor 53 constituted by a photoelectric device, whose photoelectric signal is converted by a peak-hold circuit and A/D converter into output DS, which is supplied to the main controller 20. The integrator sensor 53 is for example a pin-type photodiode that is sensitive to light having a wavelength in the far-ultraviolet range and that has a high response frequency for detecting a pulse emission from the light source 1. The coefficient (or function) of the correlation between the integrator sensor 53's output DS and the pulse illumination light IL's illuminance (exposure amount) on the wafer W's surface has been obtained beforehand and is stored in the storage unit 29 of the main controller 20.

Referring back to FIG. 1, on the reticle stage RST, a reticle R is held by electrostatic chuck or vacuum chuck. The reticle stage RST is constructed to be able to be finely driven at least two-dimensionally (in the X-direction, in the Y-direction perpendicular thereto, and in a rotation direction (θz direction) about the Z-axis perpendicular to the XY plane) on a plane perpendicular to the illumination optical system's optical axis IX (coincident with the projection optical system PL's optical axis AX) for positioning the reticle R.

Fixed on the reticle stage RST is a movable mirror 15 that reflects a laser beam sent from a reticle laser interferometer 22 (referred to as a "reticle interferometer" hereinafter), and the position of the reticle stage RST in the X-Y plane is detected all the time with a resolving power of, e.g., about 0.5 to 1 nm by the reticle interferometer 22. Although actually a movable mirror having a reflective surface perpendicular to the Y direction and a movable mirror having a reflective surface perpendicular to the X direction are provided on the reticle stage RST, and reticle Y and X interferometers corresponding to the mirrors are provided, in FIG. 1 these are represented by the movable mirror 15 and the reticle interferometer 22. Either of the reticle Y and X interferometers, for example, the reticle X interferometer is a two-axis interferometer having two measuring axes, and based on the measured values of the reticle X interferometer the θz rotation (yawing) as well as the X-position of the reticle stage RST can be measured. It is noted that end faces of the reticle stage RST may be mirror-processed to be reflective instead of the movable mirrors.

The position information of the reticle stage RST from the reticle interferometer 22 is sent through a stage control system 19 to the main controller 20, and the stage control system 19 according to instructions from the main controller 20 drives the reticle stage RST via a reticle driving portion (not shown) based on the position information thereof.

The projection optical system PL is disposed below the reticle stage RST in FIG. 1 such that its optical axis AX (coincident with the illumination optical system's optical axis IX) is parallel to the Z-direction, and is, herein, a reducing system that is telecentric bilaterally, and is a refraction optical system composed of a plurality of lens elements 60a, 60b, etc., which have a common optical axis (the optical axis AX). The projection magnification β of the projection optical system PL is, e.g., ⅕ or ¼, and, when the illumination area IAR of the reticle R is illuminated with the pulse illumination light IL from the illumination system 10, the pulse illumination light IL having passed through the reticle R forms the reduced image of the reticle R's circuit pattern via the projection optical system PL on the wafer W coated with a photo-resist.

Of the lens elements the lens element 60a uppermost and nearest to the reticle stage RST is supported by a ring-like support member 62, which is supported at three points by extendable driving devices 64a, 64b, and 64c such as piezo devices (driving device 64c in the back of the drawing being not shown) and connected to a mirror barrel 66. The lens element 60a can be moved at three points independently in the projection optical system PL's optical axis AX direction via the driving devices 64a, 64b, and 64c. That is, it can be moved vertically along the optical axis AX or tilted at any angle to a plane perpendicular to the optical axis AX depending on the extend-retract amounts of the driving devices 64a, 64b, and 64c. An imaging-characteristic correcting controller 68, according to instructions from the main controller 20, controls independently the voltages applied to the driving devices 64a, 64b, and 64c so as to control the extend-retract amounts thereof. The projection optical system PL's optical axis AX is coincident with the optical axis of lens elements 60b, etc., fixed to the mirror barrel 66 in FIG. 1.

Further, in this embodiment, formed between specific lens elements near the center in the optical axis AX direction of the projection optical system PL is an enclosed room 69, whose inside pressure is adjusted by a pressure adjusting mechanism, e.g. a bellows pump, (not shown), which is also controlled by the imaging-characteristic correcting controller 68 according to instructions from the main controller 20 to adjust the enclosed room 69's inside pressure.

The displacement in the optical axis AX direction and tilt of the lens element 60a changes the magnification, wave-front distortion, and imaging plane (focus position, etc.) of the projection optical system PL. The change of the enclosed room 69's inside pressure causes the change of the magnification and imaging plane of the projection optical system PL. Further, the plurality of lens elements (not shown) including lens element 60a in the projection optical system PL are movable so as to adjust the magnification, distortion, coma, field curvature, etc., of the projection optical system PL, and the imaging characteristics of the projection optical system PL can be adjusted through the change of the wavelength of the light source 1's light.

It is noted that mechanisms for adjusting an imaging-characteristic of the projection optical system PL (e.g., at least one of the focus position, magnification, and aberrations such as distortion) can be any ones in terms of construction, not limited to the above ones, and, for example, only the mechanism for driving the lens elements may be used without the pressure adjusting mechanism.

The stage unit 14 comprises a Y-stage 16 that can move back and forth in the Y-direction (lateral direction in FIG. 1) on a base (not shown), an X-stage 12 that can move back and forth on the Y-stage 16 in the X-direction (the direction perpendicular to the drawing of FIG. 1) perpendicular to the Y-direction, and a substrate table 18 provided on the X-stage 12. Mounted on the substrate table 18 is a wafer holder 25 for holding a wafer W as a substrate by electrostatic or vacuum chuck.

The substrate table 18 is positioned XY-two-dimensionally on and attached to the X-stage 12 to be able to move in the Z-direction and tilt, and is supported at three points by three axes (not shown) respectively, which are driven independently in the Z-direction by a wafer driving unit 21 as a driving mechanism so as to set the surface's position (position in the Z-direction and tilt) of the wafer W held by the substrate table 18 to be in a desired state.

Fixed on the substrate table 18 is a movable mirror 27 that reflects a laser beam from a wafer laser interferometer 28 (referred to as a "wafer interferometer" hereinafter), and the position in the XY plane of the substrate table 18 is detected all the time with a resolving power of, e.g., about 0.5 to 1 nm by the wafer interferometer 28 disposed externally.

Provided on the substrate table 18 are in practice a movable mirror having a reflective surface perpendicular to the Y-direction and a movable mirror having a reflective surface perpendicular to the X-direction, and wafer Y and X interferometers corresponding to the mirrors are provided, these being represented in FIG. 1 by the movable mirror 27 and the wafer interferometer 28. The wafer Y and X interferometers each are a multi-axis interferometer having plural measuring axes, and based on the respective measured values of the measuring axes of the wafer interferometer 28, the positions in the five degree-of-freedom directions (X, Y, $\theta z$, $\theta x$, and $\theta y$) except the Z-position of the substrate table 18 can be measured. The position information (or speed information) of the substrate table 18 measured by the wafer interferometer 28 is sent through the stage control system 19 to the main controller 20, and the stage control system 19 according to instructions from the main controller 20 drives the X-stage 12 and the Y-stage 16 via the wafer driving unit 21 (including all of driving systems for the X-stage 12, Y-stage 16, and substrate table 18) based on the position information. It is noted that end faces of the substrate table 18 may be mirror-processed to be reflective instead of the movable mirrors.

Further, fixed on the substrate table 18 is a reference mark FM on which a reference mark for base-line measurement which measures the distance between the detection center of an alignment detecting system ALG of an off-axis type described later and the projection optical system PL's optical axis, and other reference marks are formed.

Moreover, the exposure apparatus 100 is provided with a multi-focus-position detection system, that is a focus detection system of an oblique-incidence type, for detecting the positions in the Z-direction (optical axis AX direction) of points in and around an exposure area IA on the wafer W's surface conjugate to the illumination area IAR. The multi-focus-position detection system comprises, as shown in FIG. 1, an illumination optical system 40 having an optical fiber bundle 80, a mirror 81, a collective lens 82, a pattern-forming plate 83, a lens 84, a mirror 85, and an objective lens 86; and a light-receiving optical system 42 having an objective lens 87, a rotationally-vibrating plate 88, an imaging lens 89, a light-receiving slit plate 98, and a light-receiving device 90 composed of a lot of photo-sensors. The construction of this multi-focus-position detection system is disclosed in detail in, for example, Japanese Patent Laid-Open No. 6-283403 and U.S. Pat. No. 5,448,332 corresponding thereto. The disclosure in the above Japanese Patent Laid-Open and U.S. patent is incorporated herein by reference as long as the national laws in designated states or elected states, to which this international application is applied, permit.

Here, the components of the multi-focus-position detection system (40, 42) and their actions will be described. Illumination light having a wavelength different from that of the exposure light and that the photo-resist on the wafer W is not sensitive to is sent from a light source (not shown) to the optical fiber bundle 80, and the illumination light emitted by the optical fiber bundle 80 irradiates the pattern-forming plate 83 through the mirror 81 and collective lens 82.

A plurality of slit-like apertures (not shown) are so formed through the pattern-forming plate 83 as to be arranged in a matrix. The illumination light (beams) having passed through the plurality of slit-like apertures on the pattern-forming plate 83 transfers images of the apertures through the lens 84, mirror 85, and objective lens 86 onto the wafer W's surface, so that the images of the plurality of slit-like apertures are formed in and around the exposure area IA on the wafer W's surface.

The beams reflected by the wafer W's surface travel in the direction at an angle to the optical axis AX, that direction and the direction of the incident beams being symmetrical with respect to the optical axis AX, pass through the objective lens 87, are deflected by the rotationally-vibrating plate 88, pass through the imaging lens 89, and then form images on the light-receiving slit plate 98 in front of the light-receiving device 90, which detects the images. A signal processing unit 91 demodulates the image signals through a sensor selecting circuit 93 by using a signal having a frequency of the rotational vibration as a synchronous signal, and sends multiple focus signals obtained through that demodulation to the main controller 20.

And the main controller 20 performs focusing and level-adjustment of the exposure area IA on the wafer W based on the focus signals from the pattern of the apertures imaged in the exposure area IA via the stage control system 19 and the wafer driving unit 21.

It is noted that the construction of the multi-focus-position detection system of this embodiment is not limited to the one shown in FIG. 1.

The apparatus of FIG. 1 comprises an alignment detecting system ALG of an off-axis type constituted by an imaging alignment sensor for viewing position detection marks (alignment marks) on a wafer W and disposed on the projection optical system PL's side face, and an image processing unit (not shown) for obtaining the position information of the position detection marks on the wafer W from results of the alignment detecting system ALG viewing them and the position information of the wafer W from the wafer interferometer 28. The alignment detecting system ALG is an alignment sensor of a field image alignment (FIA) type, disclosed in, for example, Japanese Patent Laid-Open No. 2-54103 and U.S. Pat. No. 4,962,318 corresponding thereto. The position information of the position detection marks obtained by the image processing unit is supplied to the main controller 20.

The disclosure in the above Japanese Patent Laid-Open and U.S. patent is incorporated herein by reference as long as the national laws in designated states or elected states, to which this international application is applied, permit.

The main controller 20 is constituted by a microcomputer (or a work station) with a hard disk 29 as a storage unit for storing information, in which the later-described program of determining exposure conditions is installed.

In the exposure apparatus 100, the main controller 20 aligns the reticle R with the wafer W via the stage control system 19 and the wafer driving unit 21 based on the detected signals of the alignment detecting system ALG, and adjusts the surface position of the substrate table 18, by tilting it and moving it in the Z-direction via the stage control system 19 and the wafer driving unit 21 based on the detected signals of the multi-focus-position detection system (40, 42), such that the pattern surface of the reticle R becomes conjugate to the wafer W's surface with respect to the projection optical system PL and that the projection optical system PL's imaging surface coincides with the wafer W's surface, that is, the wafer W's surface falls within the depth of focus of the projection optical system PL's best imaging surface.

In this embodiment, instead of or in combination with moving the wafer W, at least one of the reticle R's position and the projection optical system PL's imaging surface (focus position) may be changed.

Next, the method of determining exposure conditions for the exposure apparatus 100 having the above construction will be described. Before the description thereof, the outline of the principle of detecting the best exposure conditions will be described below with reference to FIGS. 3A to 4B.

Figure 3A:
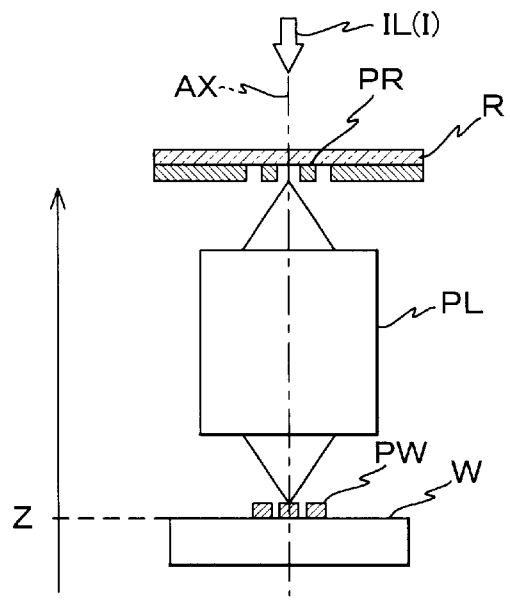
FIGS. 3A to 3C are views for explaining the principle of detecting exposure conditions.
Figure 3B:
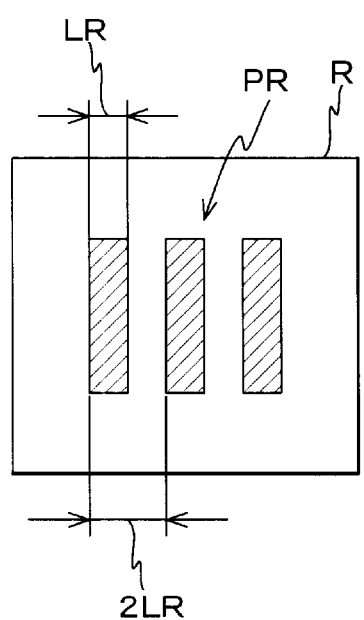

First, the principle of detecting exposure conditions, as a premise, will be described below with reference to FIGS. 3A to 3C. As shown in FIG. 3A, the exposure illumination light IL having an intensity I (exposure energy) irradiates a reticle R, and the wafer W is positioned at position Z in the projection optical system PL's optical axis AX direction (the Z-direction). FIG. 3B shows the conceptional view of a test pattern PR formed on the reticle R, and FIG. 3C shows the conceptional view of a pattern PW transferred on a shot area on a wafer W.

Figure 3C:
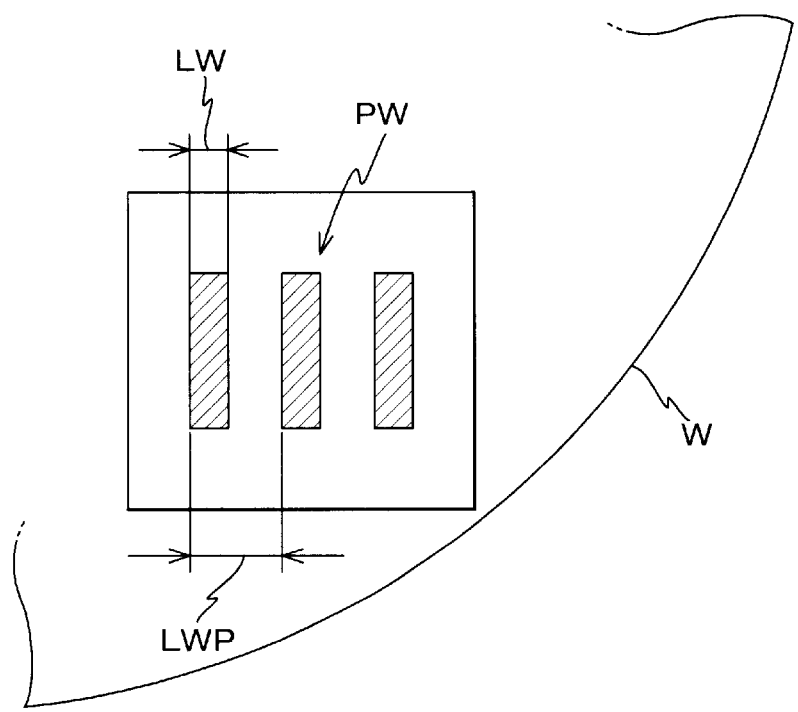

Here, as shown in FIG. 3B, the test pattern PR formed on the reticle R's pattern surface is constituted by a line-and-space pattern having a line width LR and an arrangement period 2LR, and the pattern PW that is the test pattern PR transferred on the wafer W is a pattern having a line width LW and an arrangement period LWP as shown in FIG. 3C.

Let $\beta$ be the projection magnification of the projection optical system PL, and in an ideal exposure, the following equations exist, $$LW = \beta \cdot LR \quad (1)$$

$$LWP = 2\beta \cdot LR. \quad (2)$$

However, when exposure energy I (more precisely, an integral exposure amount (integral energy amount) at a point on the wafer W, $P = \Sigma I$), the position Z in the Z-direction of the wafer W (hereinafter, also called "focus position"), or another exposure condition varies, because the line width LW of the pattern PW varies, the equation (1) may not be satisfied, while the equation (2) is satisfied.

Therefore, after transferring the test pattern PR formed on the reticle R onto the wafer W under various sets of conditions of integral exposure amount and focus position, a transferred image whose dimensions are closest to satisfying the equation (1) is found out of the transferred images on the wafer W (e.g. resist images after the development of the wafer W), and the image's exposure conditions are determined to be the best ones (the best focus position and the best exposure dose amount).

To this end, with for example the image data of an ideal pattern satisfying the equation (1) being as template pattern data, the images of patterns PW transferred onto the wafer W under the various sets of exposure conditions are picked up, and pattern matching with the template pattern data is performed on the image data so as to obtain a correlation coefficient C of each image datum. And after obtaining the distribution of the correlation coefficients in a two-dimensional coordinate system (P, Z), with a threshold value for correlation coefficient C being set, the best exposure conditions can be determined from the shape formed by the images whose correlation coefficients almost equal the threshold value.

However, in the case of using a test pattern including features having a line width of about the resolution limit, as described above, even if the image data of such an ideal pattern is the template pattern data, it is not easy to determine the real, best exposure conditions. This is because an optimum template pattern varies depending on the type of measurement pattern, and then depending on the template pattern, correlation coefficients in and around the boundary between the pattern existing and not existing may become low, so that it is difficult to detect the boundary, and because it is difficult for the unskilled to determine an appropriate threshold value for accurately determining the best exposure conditions.

In this embodiment, a simple method based on a new idea is provided for detecting the boundary between the transferred pattern existing and not existing with utilizing the advantage of pattern matching that it is objective and quantitative.

Figure 4A:
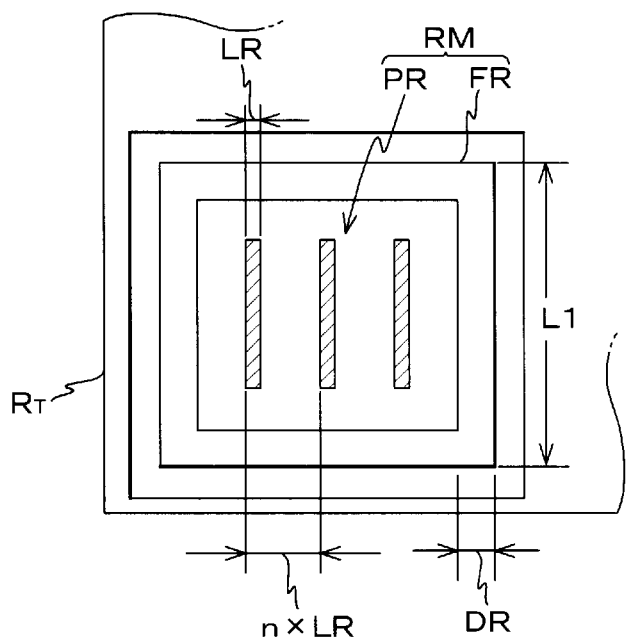
FIGS. 4A and 4B are views for explaining the principle of detecting exposure conditions in the first embodiment, FIG. 4A being a plan view showing a test reticle with its part omitted, FIG. 4B being a plan view showing a wafer on which the pattern of the test reticle in FIG. 4A has been transferred.

This embodiment uses a test reticle $R_T$ on which a test mark RM as a test exposure pattern shown in FIG. 4A is formed and, as template pattern data, image data of a field where a transferred image of a measurement pattern PR does not substantially exist out of fields (divided areas) on the wafer W onto which the test mark RM has been transferred.

Here, the test mark RM on the test reticle $R_T$ will be described. In FIG. 4A, formed on the pattern surface of the test reticle $R_T$ is the test mark RM comprising a square-frame-like reference pattern FR having a frame width DR and a side length L1, and a measurement pattern PR located substantially in the center of the reference pattern FR and which is a line-and-space pattern having a line width LR and an arrangement period n×LR, where n is an integer greater than one, and whose positional relationship with the reference pattern FR is known.

Figure 4B:
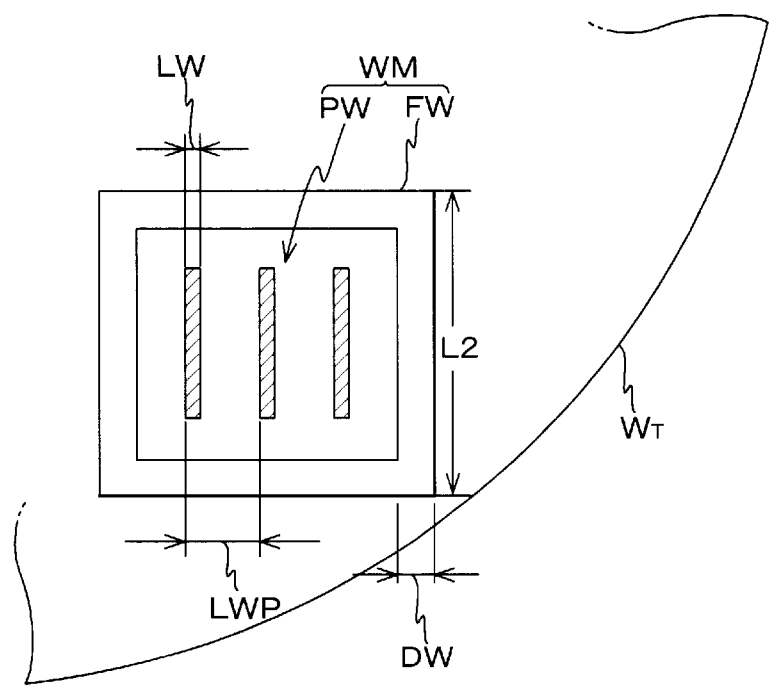

A pattern WM, which is a transferred image of the test mark RM on a wafer $W_T$, is a pattern shown in FIG. 4B where a line-and-space pattern PW having a line width LW and an arrangement period LWP is located substantially in the center of a square-frame-like feature FW having a frame width DW and a side length L2.

That is, in the case of using as the template pattern data the image data of a field where a transferred image of the measurement pattern PR does not exist substantially, because using only the measurement pattern PR's image makes it not effective to perform template matching on the image data of fields, the test reticle $R_T$, on which the test mark RM having the frame-like reference pattern FR and the measurement pattern PR is formed, is used.

In template matching described later, the feature FW, that is a transferred image of the reference pattern FR on the wafer $W_T$, is used as a reference or indicator.

Since the line widths LR and DR are usually, for example, 0.65 to 1 μm and about 5 μm respectively, a transferred image FW of the feature FR is considered to appear even under such exposure conditions that a transferred image PW of the measurement pattern PR does not appear.

Figure 5:
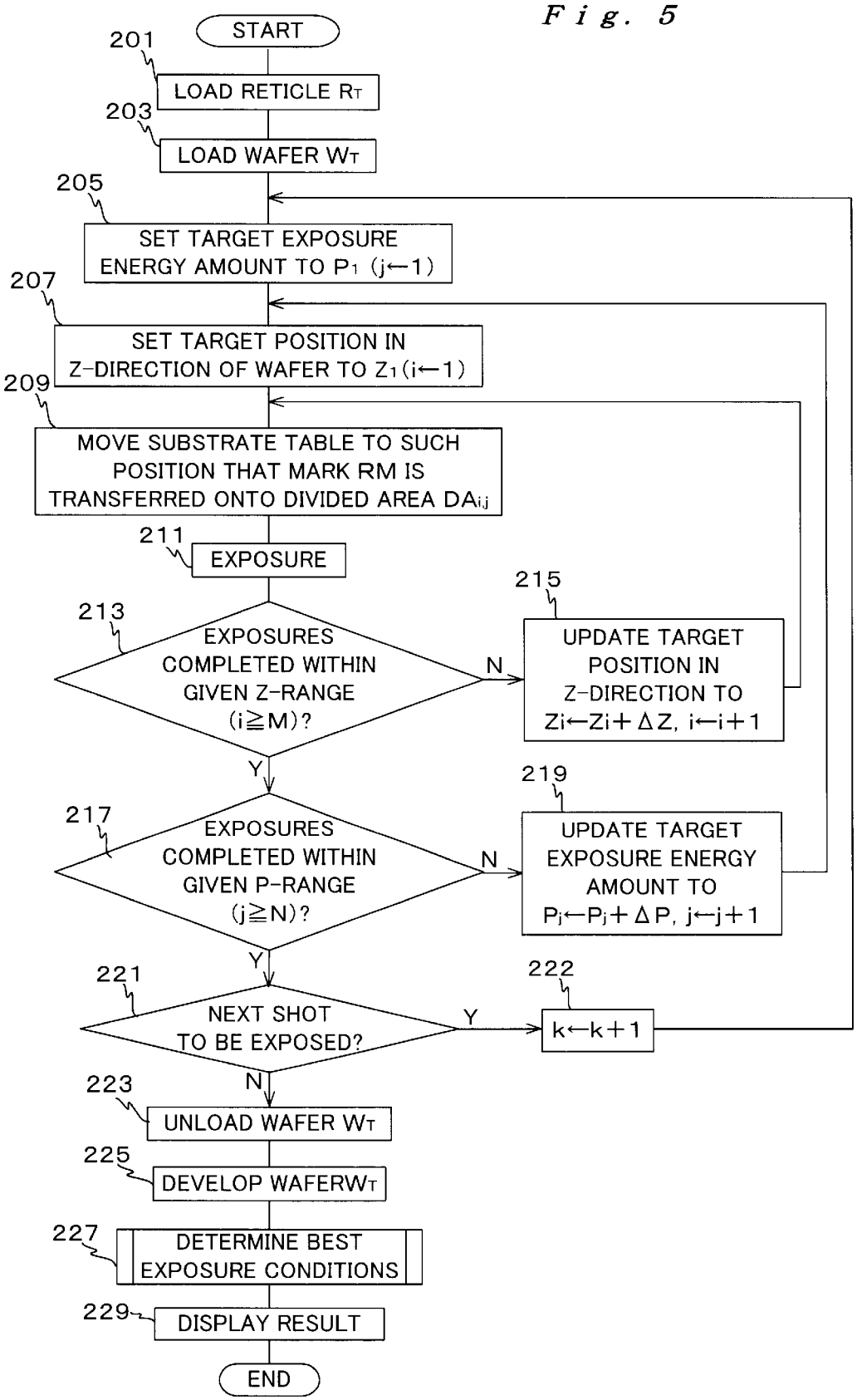
FIG. 5 is a flow chart showing the processing algorithm for determining exposure conditions.
Figure 6:
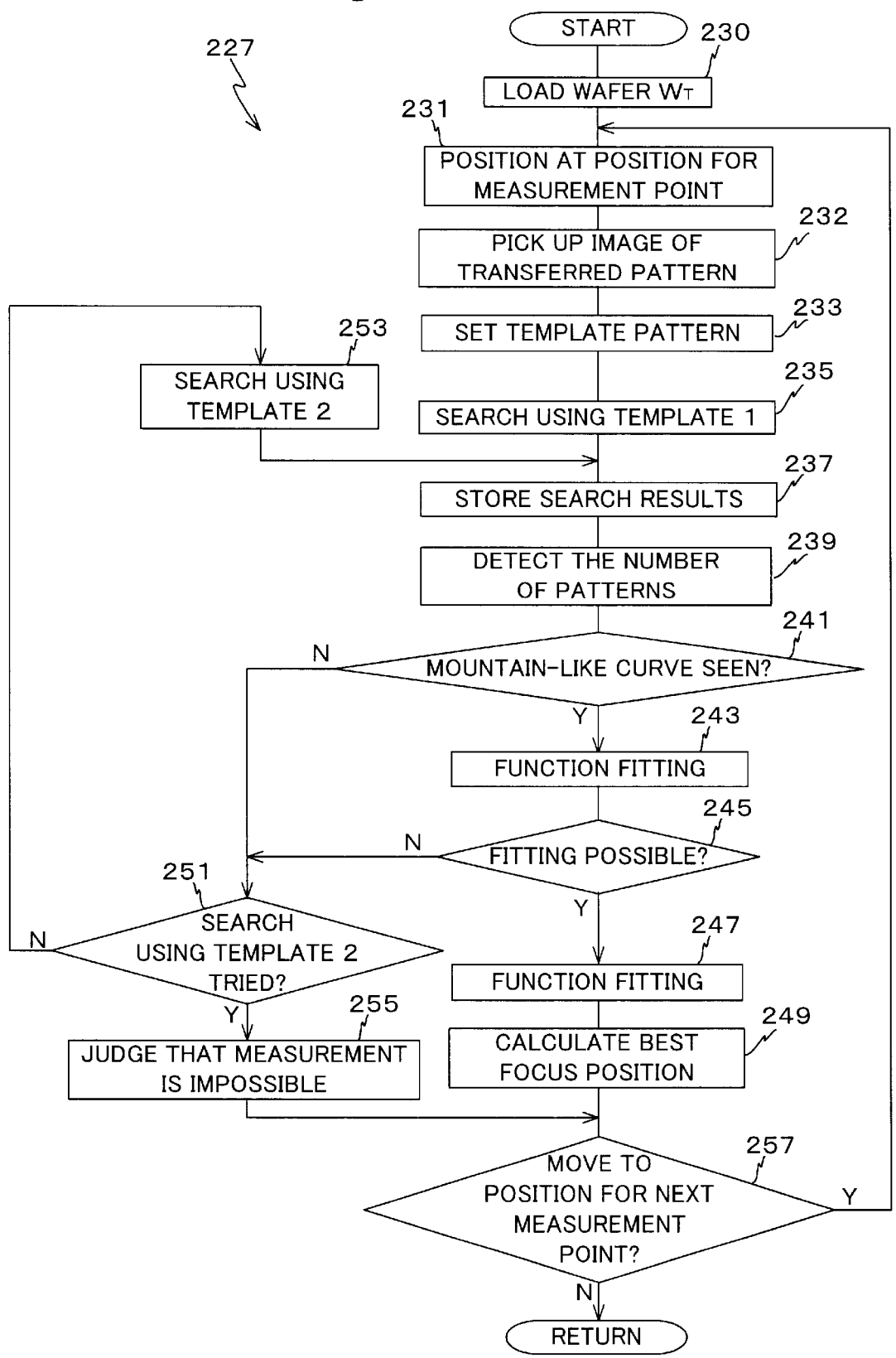
FIG. 6 is a flow chart showing the process of subroutine 227 of FIG. 5.

This embodiment's method of determining exposure conditions will be described in more detail below with reference to FIGS. 5 to 12B. FIGS. 5 and 6 show a flow chart corresponding to the processing algorism for determining exposure conditions when the program for determining exposure conditions, in the hard disk 29, is executed by CPU of the main controller 20. For the sake of simplicity the case of determining exposure conditions from results of the exposures of one wafer $W_T$ will be described.

It is when an operator has entered via an input-output unit (not shown) a command to begin to determine exposure conditions and accordingly the program for determining exposure conditions has been loaded into the main memory of the main controller 20 that the control algorism starts. Counters i and j indicating respectively the row number and column number of a divided area $DA_{i,j}$ later-described and counter k indicating the number of a shot area are all initially set to 1, the counters i and j corresponding to a target focus position $Z_i$ and a target exposure energy amount $P_j$ respectively.

Figure 7:
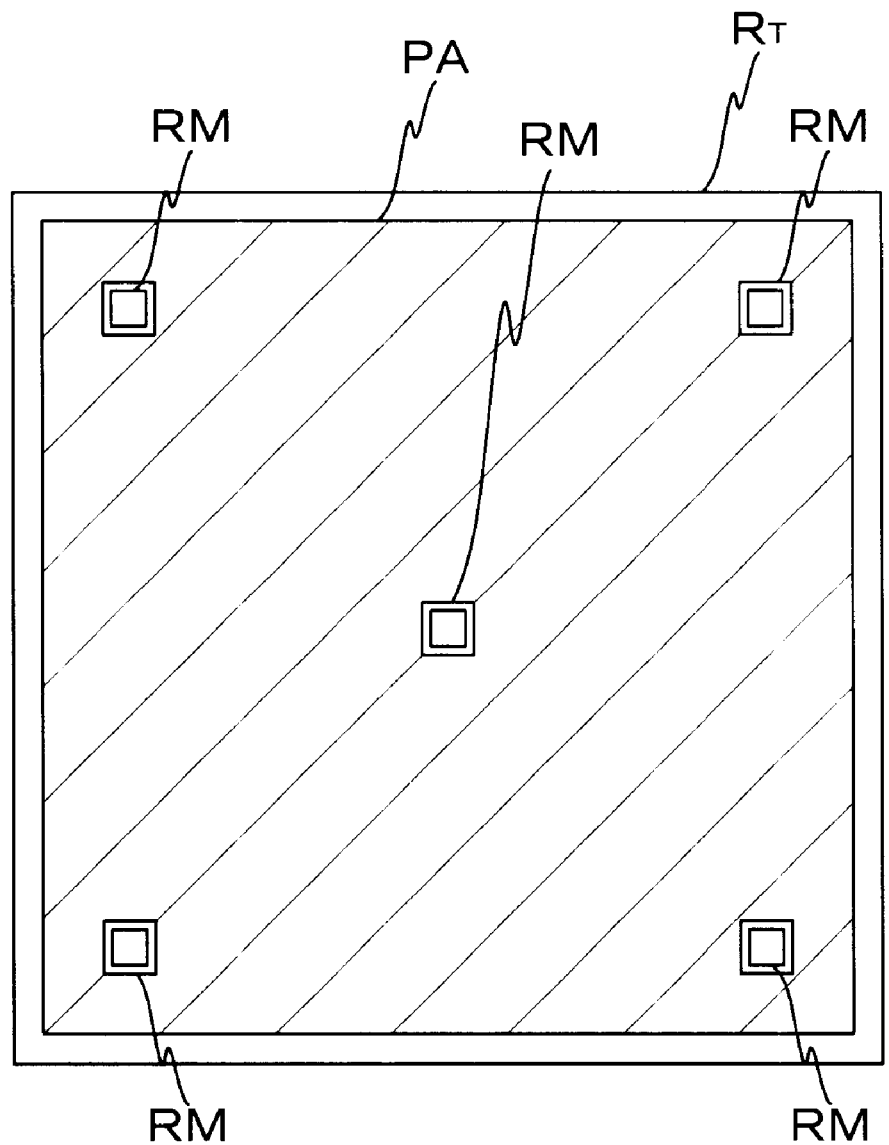
FIG. 7 is a plan view showing the whole of a reticle $R_T$.

First, in step 201 of FIG. 5, a reticle loader (not shown) loads the test reticle $R_T$ (hereinafter, "reticle $R_T$" for short) as a measurement mask onto the reticle stage RST. The reticle $R_T$ has five test marks RM (see FIG. 4A) formed in five areas, the center and four corners, of its pattern area PA as shown in FIG. 7, and the lines' arrangement period of the measurement pattern PR is equal to for example 5LR. The pattern area PA except the five areas for the test marks RM is opaque to the exposure light.

Referring back to FIG. 5, subsequently in step 203, according to instructions to load a wafer $W_T$, a wafer transport system (not shown) loads a wafer $W_T$ onto the substrate table 18.

Next, in step 205 the target exposure amount $P_j$ is set to an initial value $P_1$, referring to counter j, which is equal to 1 here. In this embodiment, in exposure step 211 described later, the target exposure energy amount varies by $\Delta P$ from $P_1$ through $P_N$ (e.g. N=23) for determining exposure conditions. The exposure energy amount is set via the energy roughly-adjusting unit 3 or the light source 1. That is, when the light source 1 is a pulse light source such as an excimer laser, the exposure energy amount is adjusted by changing at least one of the intensity (energy per pulse) of the illumination light IL on the wafer $W_T$ and the number of pulses of the illumination light IL in one exposure of the wafer $W_T$. Here, the energy per pulse of the illumination light IL can be adjusted by at least one of changing the energy per pulse of the laser beam LB through adjusting control parameters of the light source 1 such as the voltage applied thereto, and changing the transparency of the roughly-adjusting unit 3 to the laser beam LB (the laser beam LB's energy transmitted). Together with changing the number of pulses of the illumination light IL in one exposure of the wafer $W_T$, the frequency of the light emitted by the light source 1 may be adjusted so as to shorten the time it takes to expose the wafer $W_T$ to a given amount of exposure energy, and when the light source 1 is a continuous light source such as a mercury lamp, the exposure energy amount is adjusted by changing at least one of the intensity (illuminance) of the illumination light IL on the wafer $W_T$ and the irradiation time (exposure time). Here, the intensity of the illumination light IL can be adjusted by adjusting control parameters of the light source 1 such as the electrical current, and the irradiation time (exposure time) of the illumination light IL can be adjusted by controlling a shutter's open time. It is noted that if the exposure apparatus of FIG. 1 is of the scan exposure type such as the step-and-scan type, whether the light source 1 is a pulse light source or a continuous light source, the exposure energy amount can be adjusted by changing at least one of four factors, that is, the intensity, the number of pulses or irradiation time of the illumination light IL, the scan speed of the wafer $W_T$ in scan exposure, and the exposure area's width in the scan direction on the wafer $W_T$.

Next, in step 207 the wafer $W_T$'s target focus position $Z_i$ is set to an initial value $Z_1$, referring to counter i, which is equal to 1 here, the focus position being a position in the Z-direction. In this embodiment, for determining exposure conditions, the target focus position varies by $\Delta Z$ from $Z_1$ through $Z_M$ (e.g. M=13).

Subsequently, in step 209 referring to counters i, j, and k, the substrate table 18 is moved to such a position that the five test marks RM on the reticle $R_T$ are transferred at the same time onto respective divided areas $DA_{i,j}$, which are areas $DA_{1,1}$ here, in five measurement areas DB1 to DB5, which each have a plurality of divided areas $DA_{i,j}$ as fields arranged in a matrix, in a k'th shot area on the wafer $W_T$, which is a first shot areas here, via the stage control system 19, the wafer driving unit 21, etc.

Figure 8:
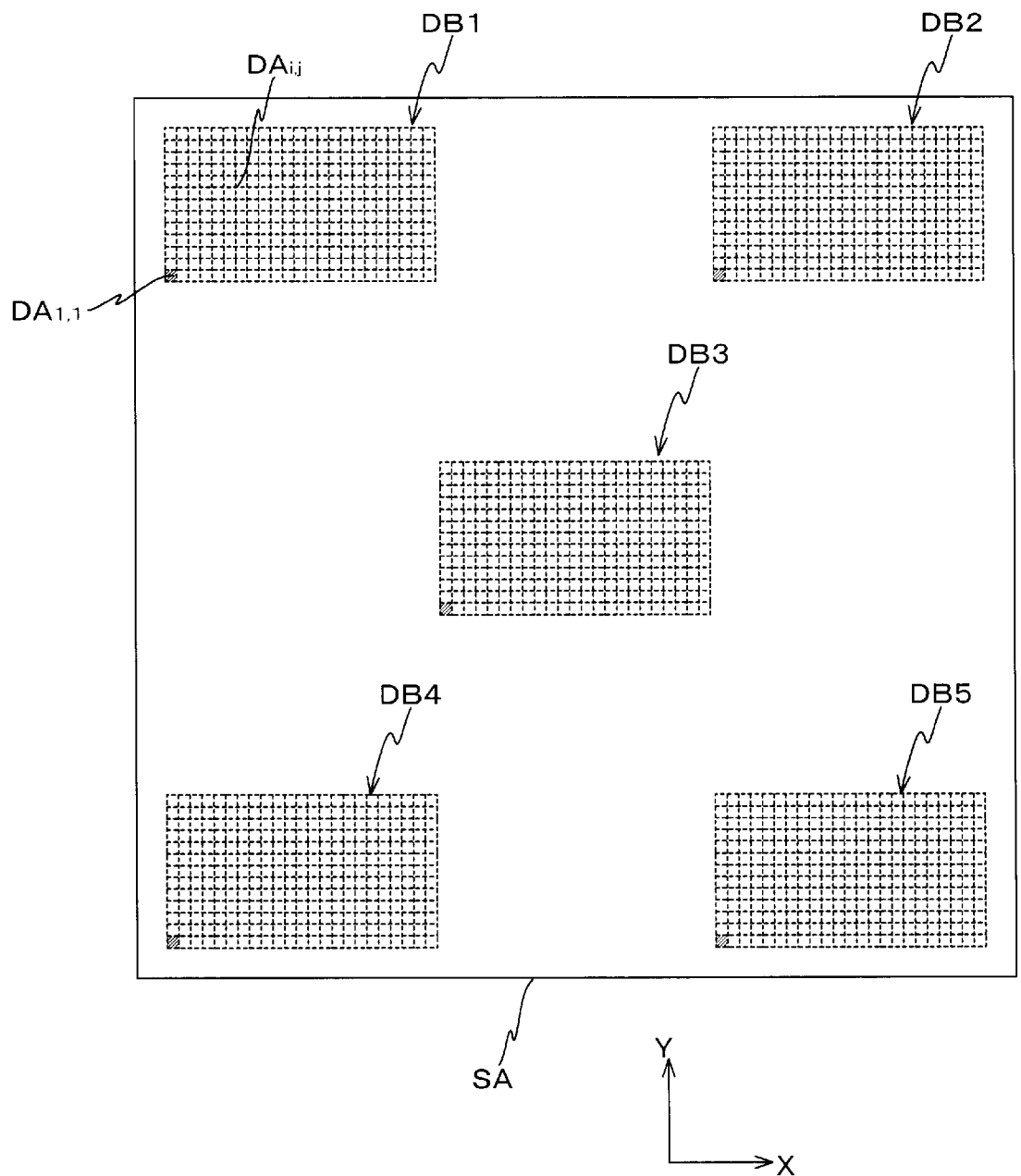
FIG. 8 is a view for showing the arrangement of divided areas in a shot area on a wafer $W_T$.
Figure 9:
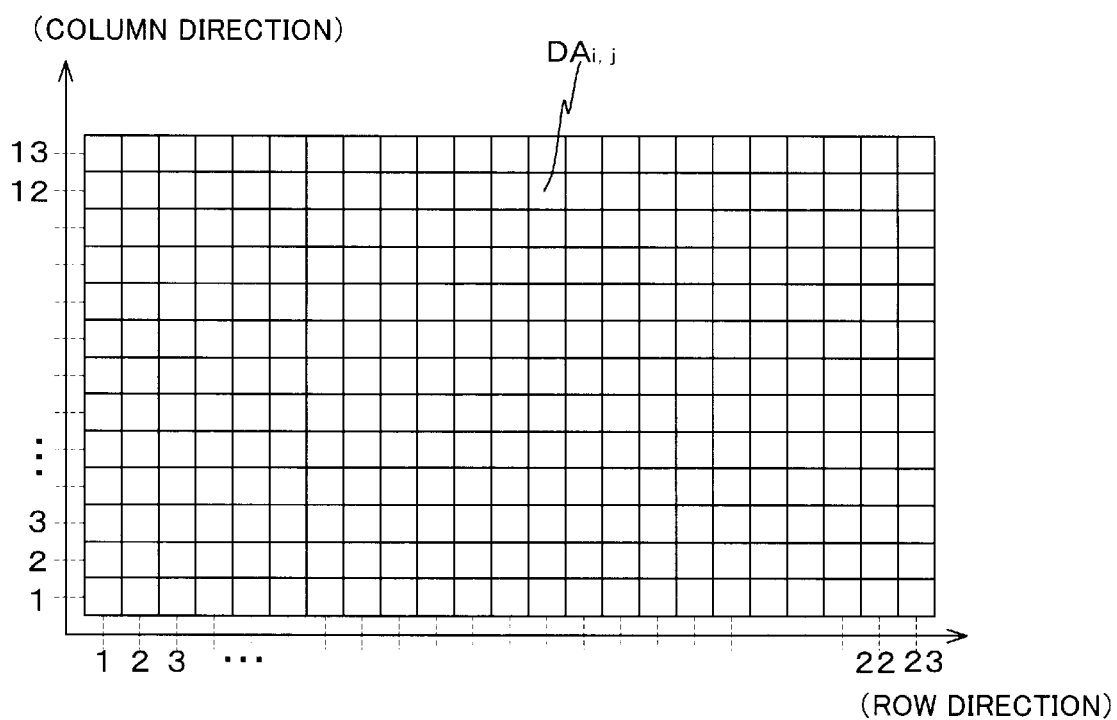
FIG. 9 is a view for showing the arrangement of divided areas.

FIG. 8 shows the arrangement of divided areas $DA_{i,j}$ of the five measurement areas DB1 to DB5 on the wafer $W_T$. While a plurality of shot areas are arranged in a matrix on the wafer $W_T$, FIG. 8 shows one shot area SA of the shot areas, where the five measurement areas DB1 to DB5 corresponding to the five test marks RM, which test exposure transfers, exist. Each of the measurement areas DB1 to DB5 is divided into imaginary areas in a matrix arrangement with M rows and N columns, which areas are divided areas $DA_{i,j}$ (i=1 through M; j=1 through N) as fields, each of which an image of the test mark RM is formed at one exposure. The row and column directions of the matrix of divided areas $DA_{i,j}$ are in the +X direction and in the +Y direction respectively as shown in FIG. 9, in which j and i increase.

Referring back to FIG. 5, in next step 211, a first exposure of the wafer $W_T$ is performed at an integral exposure amount, which the main controller 20 adjusts to be equal to the target value (here, $P_1$) set in the above step 205, in the above-mentioned way. For this exposure, the main controller 20 adjusts the position of the substrate table 18's upper surface such that the Z-position of the wafer $W_T$'s surface is at the target focus position (here, $Z_1$) set in the above step 207, based on the detected signals of the multi-focus-position detection system (40, 42) via the stage control system 19 and the wafer driving unit 21.

After the completion of exposure in step 211, step 213 checks by referring to counter i whether or not exposures at the target exposure amount within a predetermined Z-position range are completed. Here, because counter i is equal to 1 and only the transfer of the test mark RM onto divided area $DA_{1,1}$ at the focus position $Z_1$ has been completed, the answer to the check in step 213 is NO, and the process proceeds to step 215.

In step 215, counter i is increased by 1 (i←i+1) and the target position in the focus direction is updated to $Z_{i+1}$ (here $Z_2$), and the process returns to step 209, which, referring to counters i, j, moves the substrate table 18 to a position for transferring the test mark RM onto next divided area $DA_{i,j}$, which is area $DA_{2,1}$ here, and step 211 performs exposure for the transfer of the test mark RM onto divided area $DA_{2,1}$ like on divided area $DA_{1,1}$.

After that, until step 213 judges that exposures within a predetermined Z-range have been completed, exposures are consecutively performed for the transfer of the test mark RM onto divided areas $DA_{i,1}$ (i=3 through M). After the completion of exposures at the target energy amount $P_1$ in this way, the answer in step 213 becomes YES, and the process proceeds to step 217.

Step 217 checks by referring to counter j whether or not exposures within a predetermined exposure energy amount range are completed. Here, because counter j is equal to 1 and only exposures at the exposure energy amount $P_1$ has been completed, the answer to the check in step 217 is NO, and the process proceeds to step 219.

In step 219, counter j is increased by 1 (j←j+1) and the target energy amount is updated to $(P_j+\Delta P)$, here $P_2$, and the process returns to step 207.

After in step 207 the target position in the focus direction of the wafer $W_T$ is set to $Z_1$, the sequence of steps 209, 211, 213, and 215 is repeated, which with sequentially updating the target focus position, performs exposures for the transfer of the test mark RM onto divided areas $DA_{i,2}$ (i=1 through M).

After the completion of the transfer of the test mark RM onto divided areas $DA_{i,2}$ (i=1 through M), the answer in step 213 is YES, and until step 217 judges that exposures within the predetermined exposure energy amount range are completed, exposures are consecutively performed for the transfer of the test mark RM onto divided areas $DA_{i,j}$ (i=1 through M; j=3 through N) in the first shot area. After the completion of exposures within the predetermined exposure energy amount for the transfer of the test mark RM onto all divided areas $DA_{i,j}$ of the measurement areas DB1 to DB5 in the first shot area, the answer in step 217 becomes YES, and the process proceeds to step 221.

Step 221 checks referring to counter k, which indicates the shot area number, whether or not a next shot area is to be exposed, that is, whether or not a preset number of shot areas have been exposed, the next shot area being a second shot area here. If the answer is YES, the process proceeds to step 222, where counter k is increased by 1, and returns to step 205, after which the test marks RM are transferred onto all divided areas $DA_{i,j}$ in the second shot area likewise, and after the completion of exposures of all divided areas $DA_{i,j}$ in the second shot area, the answer in step 217 becomes YES, and the process proceeds to step 221, which checks whether or not a next shot area is to be exposed. If the answer is YES, the process proceeds to step 222, where counter k is increased by 1, and returns to step 205, after which the above sequence is repeated until the preset number of shot areas have been exposed. After the completion of exposures of the preset number of shot areas, the answer in step 221 becomes NO, and the process proceeds to step 223.

In step 223 the wafer transport system (not shown) unloads, according to instructions, the wafer $W_T$ from the substrate table 18 and transfers it to a developer (not shown) such as a coater-developer.

Figure 10:
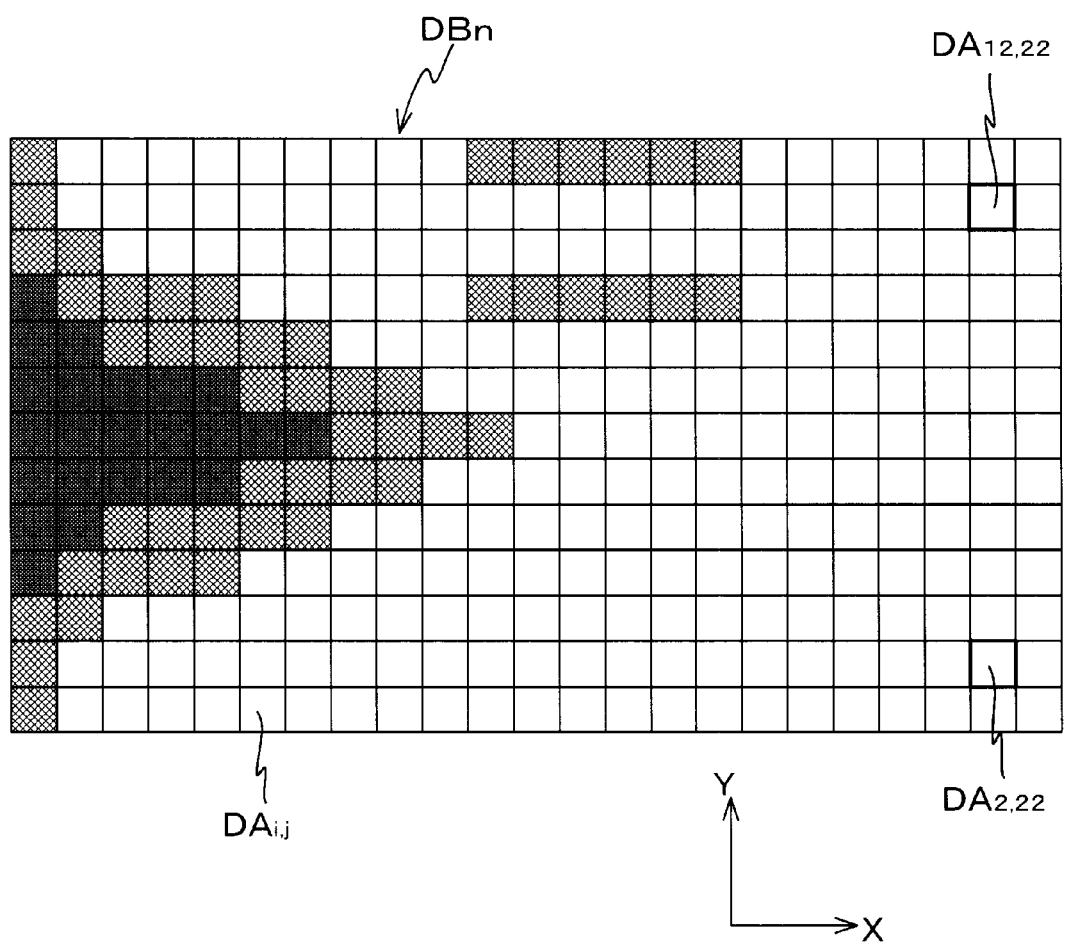
FIG. 10 is a view showing diagrammatically an example of measurement area $DB_n$ on a wafer W developed.

In next step 225 the coater-developer, according to instructions to its control system, develops the wafer $W_T$, so that resist images of transferred patterns on divided areas $DA_{i,j}$ of the measurement areas DB1 to DB5 in the shot areas on the wafer $W_T$ are formed, each of the patterns including the reference pattern. FIG. 10 shows a diagrammatic view of an example of a measurement area DBn (n=1 through 5) on the wafer $W_T$ after the development, where the darker a divided area is in brightness, the clearer the measurement pattern PR's resist image is, where the lighter a divided area is, the less clear the measurement pattern PR's resist image is, and where in a white area no measurement pattern PR's resist image is seen and exists substantially (hereinafter called "white pattern area" for the sake of convenience). Note that any divided area $DA_{i,j}$ has a transferred image (resist image) FW of the reference pattern therein.

After receiving a notification from the control system of the coater-developer that the development of the wafer $W_T$ is completed, the process proceeds to step 227, which determines the best exposure conditions.

FIG. 6 shows the flow chart of subroutine 227, where first in step 230, the wafer transport system (not shown) loads according to instructions the wafer $W_T$ onto the substrate table 18 like in step 203, after which wafer alignment of, for example, an enhanced global alignment (EGA) type is performed by using the alignment detecting system ALG (see FIG. 1). The EGA type of wafer alignment is disclosed in, for example, Japanese Patent Laid-Open No. 61-44429 and U.S. Pat. No. 4,780,617 corresponding thereto. The disclosure in the above Japanese Patent Laid-Open and U.S. patent is incorporated herein by reference as long as the national laws in designated states or elected states, to which this international application is applied, permit.

Next step 231 positions the wafer $W_T$ at such a position that the alignment detecting system ALG can detect the measurement area DB1 in the first shot area, by controlling the movements of the X-stage 12 and Y-stage 16 via the stage control system 19 and the wafer driving unit 21 based on results of the wafer alignment with monitoring the measured values of the interferometer 28.

In next step 232, the alignment detecting system ALG picks up an image of the resist images formed in divided areas $DA_{i,j}$ of the first measurement area DB1 in the first shot area, and the image data is taken in. Although images of the resist images formed in all of M×N divided areas $DA_{i,j}$ of the measurement area DB1 are picked up at one time here, for example if it is necessary to improve the resolution in the image datum of each divided area, the image data of individual divided areas may be taken in by repeating stepping the substrate table 18 two-dimensionally on the X-Y plane by a predetermined distance and then picking up the image of a different divided area's resist image with a larger magnification by the alignment detecting system ALG.

Next step 233 sets template pattern data. Here, at least one image datum (white pattern datum) selected from those of the divided areas $DA_{i,j}$ and where no measurement pattern's resist image substantially exists is set as template pattern data. For example the image data of divided areas $DA_{2,22}$ and $DA_{12,22}$ in FIG. 10 are selected as the template pattern data and hereinafter are called templates 1 and 2 respectively for the sake of convenience.

Step 235 searches by use of template 1 in the following manner.

(1) First, the correlation coefficient $C_{i,j}$ of each divided area $DA_{i,j}$ is obtained by pattern-matching the image datum of the pattern transferred on the divided area $DA_{i,j}$ with template 1, which, when the frame-like features are coincident with each other in comparing the image datum of the transferred image of the reference pattern FR in template 1 and the image datum of the transferred image of the reference pattern FR in each divided area $DA_{i,j}$, calculates the correlation coefficient $C_{i,j}$ thereof, considering that the image datum of the divided area $DA_{i,j}$ has been detected.

(2) Next, after normalizing the correlation coefficients $C_{i,j}$ such that the maximum $C_{i,jmax}$ and minimum $C_{i,jmin}$ become 1000 and zero respectively, the original minimum being usually zero, the threshold value is set to be equal to a relatively high value in the range of, e.g., about 700 to 900, taking into account the distribution of the normalized correlation coefficients. Usually in the case of using the white pattern datum as the template pattern data, it is not easy to appropriately determine the threshold value, but this method can do so readily and appropriately.

(3) Next, comparing the correlation coefficient $C_{i,j}$ of each divided area $DA_{i,j}$ and the threshold value to produce a binary numeral result. FIG. 11 shows an example of the binary numeral results in the form of a table.

Next, step 237 stores the search results, i.e. the binary numeral results, of step 235 in a predetermined area of RAM in such a way as to be able to identify them with respective divided areas $DA_{i,j}$.

Next step 239 rearranges the search results, i.e. the binary numerals, in the order in which the divided areas are arranged, and detects the number of residual patterns, that is the number of zeros, for each focus position (each row in FIG. 11), in which so-called jump areas having a different value from divided areas around them are ignored. The number of the residual patterns for each focus position as the result is shown on the left side in FIG. 11.

While the causes of such jump areas can be false recognition in measurement, miss-shot of the laser beam, dust, noise, etc., filter processing may be performed in order to reduce the effect of the jump areas on the results of detecting the numbers of residual patterns. One kind of filter processing is to calculate the average of data of 3×3 divided areas whose center is a divided area to be evaluated. It is noted that filter processing may be performed on the correlation coefficients, data prior to producing binary numeral results, in which case the effect of jump areas can be reduced more effectively.

Step 241 checks whether or not a mountain-like curve is seen in the result of the above step 239. In the case of FIG. 11, because the number of residual patterns is 11 for the center focus position and 1 for both ends of the focus position axis, the answer to the check in step 241 becomes YES, and the process proceeds to step 243.

Figures 12A, 12B:
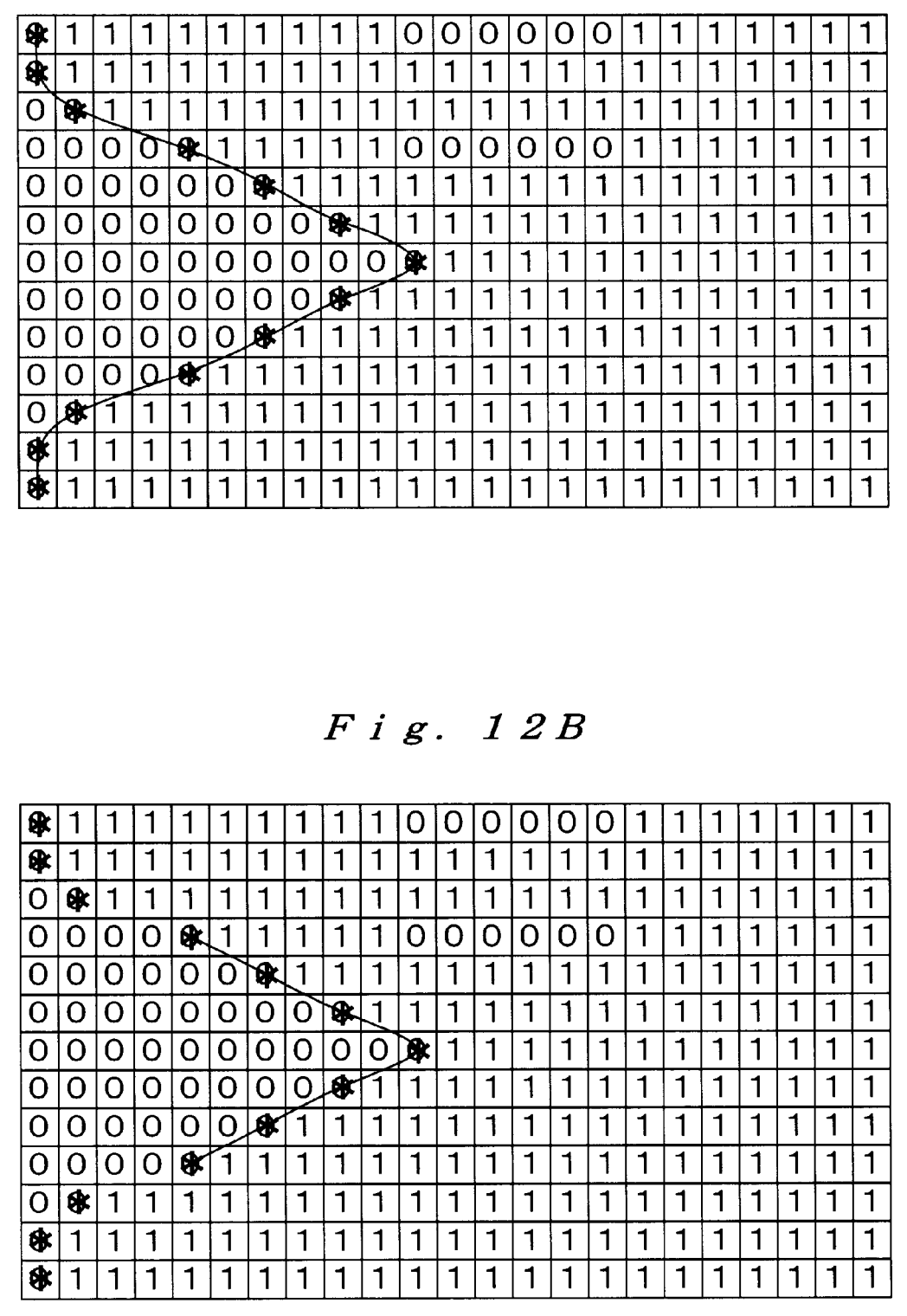

Step 243, as shown in FIG. 12A, converts the numbers of patterns for the respective focus positions into exposure energy amounts, and plots them. Here, because in exposures of the wafer $W_T$, divided areas $DA_{i,j}$ is of the same size and the difference in exposure energy amount between adjacent divided areas in the row direction and the difference in focus position between adjacent divided areas in the row direction are constant (at $\Delta P$ and at $\Delta Z$ respectively), the matrix arrangement of divided areas $DA_{i,j}$ on the wafer $W_T$ coincides with the arrangement of the sets of coordinates $(P_j, Z_i)$ in a two-dimensional coordinate system (P, Z). Therefore, as described above, the numbers of patterns for the respective focus positions are considered to be proportional to the exposure energy amounts. And as shown in FIG. 12A, step 243 fits an n-order approximate curve close to the above plotted points, which is called function fitting herein, where n is an integer of for example 4 to 6.

Next step 245, by checking whether or not the approximate curve fitted in step 243 has an extreme value, checks whether or not the function fitting has been possible, and if the answer is YES, the process proceeds to step 247, which again fits an n-order approximate curve close to the plotted points, especially closer to points around the obtained extreme value than the previous curve, as shown in FIG. 12B.

Next step 249 determines an extreme value of the approximate curve fitted in step 247 as the best focus position (one of the best exposure conditions), and stores it in an area of RAM for storing results, and the process proceeds to step 257.

Step 257 determines whether or not to move to a next measurement area, by checking whether or not template matching for determining the best exposure conditions has been completed for all measurement areas in all shot areas on the wafer $W_T$ to be measured. If the answer is YES, the process returns to step 231, after which the above sequence is repeated.

If the answer to the check in step 245 is NO, the process proceeds to step 251, which checks whether or not the search using template 2 has been performed. If the answer to this check is NO, the process proceeds to step 253, which performs the search using template 2. After the completion of the search, the process proceeds to step 237, which stores the search results, i.e. the binary numeral results, of step 253 in the predetermined area of RAM in such a way as to be able to identify them with respective divided areas $DA_{i,j}$. After that, the above sequence is repeated.

Meanwhile, if the answer to the check in step 251 is YES, the process proceeds to step 255, which stores the judgment that the measurement is impossible as information in the area of RAM for storing results, and the process proceeds to step 257.

As opposed to the above, if the answer to the check in step 241 is NO, the process proceeds to step 251, after which the above sequence is repeated.

After, in this way, for all measurement areas in all shot areas on the wafer $W_T$ to be measured, the best exposure conditions are determined or the judgment that the measurement is impossible is made, the answer in step 257 is NO, and the process proceeds to step 229 in the main routine of FIG. 5.

And step 229 of FIG. 5 stores the data stored in step 227 in the area of RAM for storing results, i.e. data of the best focus positions calculated in step 249 or the judgment that the measurement is impossible made in step 255 in the hard disk 29, displays it on the screen of a display unit (not shown), and ends the process of the present routine.

After that, for example an operator, based on the results displayed in step 229, calculates the average of the calculated best focus positions of each measurement area DBn's instances of the plurality of shot areas as the best focus position for the measurement area DBn, that is, for a corresponding measurement point in the field of view of the projection optical system PL. Further, the field curvature of the projection optical system PL can be calculated based on the best focus positions calculated for the five measurement points. Needless to say, the main controller 20 may be programmed to automatically calculate the best focus positions and the field curvature. It is remarked that the best focus position may be calculated from one shot area and not the plurality of shot areas.

Next, the exposure operation of the exposure apparatus 100 of this embodiment in manufacturing devices will be described below.

It is assumed that the best focus position information or the best focus position and field curvature information has been already entered into the main controller 20 via the input-output unit (not shown).

For example, if the field curvature information has been already entered, before exposure, the main controller 20 corrects the imaging characteristics of the projection optical system PL so as to correct the field curvature as much as possible by driving the lens element 60a via the imaging-characteristic correcting controller 68 or by adjusting the pressure inside the enclosed room 69.

According to instructions from the main controller 20 the reticle loader (not shown) loads a reticle R having a given circuit sub-pattern to be transferred thereon onto the reticle stage RST. At the same time, the wafer loader (part of the wafer transport system) loads a wafer W to be exposed onto the substrate table 18.

Next, the main controller 20 performs preparation such as reticle alignment, the base-line measurement for the alignment detecting system ALG, and wafer alignment according to the EGA method (enhanced global alignment) by using the reticle microscopes (not shown), the reference mark plate FM on the wafer table 18, the alignment detecting system ALG, etc., according to a predetermined procedure. The reticle alignment and base-line measurement are disclosed in, for example, Japanese Patent Laid-Open No. 4-324923 and U.S. Pat. No. 5,243,195 corresponding thereto. EGA is disclosed in detail in, e.g., Japanese Patent Laid-Open No. 61-44429 and U.S. Pat. No. 4,780,617 corresponding thereto. The disclosures in the above Japanese Patent Laid-Opens and U.S. patents are incorporated herein by reference as long as the national laws in designated states or elected states, to which this international application is applied, permit.

After the completion of such preparation, exposures of the wafer W are performed in the following manner. First, the main controller 20 moves the substrate table 18 such that a first shot area on the wafer W is positioned at an exposure position, via the stage control system 19 and the wafer driving unit 21 based on X-Y position information (or speed information) of the wafer W measured by the wafer interferometer 28.

After moving the wafer W to the exposure position, the main controller 20 adjusts the surface position of the substrate table 18 such that the surface of the wafer W's shot area to be exposed falls within the depth of focus of the projection optical system PL's image plane, whose imaging characteristics have been corrected, by tilting it and moving it in the Z-direction via the wafer driving unit 21 based on the Z-position information of the wafer W detected by the multi-focus-position detection system (40, 42) (auto-focus and auto-leveling), and then exposes the shot area.

After the completion of exposure of the first shot area, i.e. transferring the reticle pattern, the substrate table 18 is stepped by one shot area dimension, and exposure is performed in the same way as for the first shot area.

After that, stepping and exposure are repeated, so that a desired number of patterns are formed on respective shot areas on the wafer W.

As described above, according to the first embodiment's method of determining exposure conditions for the exposure apparatus 100, while changing one of the two exposure conditions under consideration, i.e. the focus position and the exposure dose amount (energy amount or integral exposure amount) by steps, each time the reticle $R_T$ having the test marks RM each including the measurement pattern PR and the reference pattern FR formed thereon (see FIG. 4A) is illuminated with the illumination light IL to transfer the test marks RM through the projection optical system PL onto respective divided areas $DA_{i,j}$ of the measurement areas DBn in a shot area on the wafer $W_T$ coated with a resist, then updating i or j (steps 205 through 221 of FIG. 5). As a result, formed in each shot area are the matrix arrangements of divided areas $DA_{i,j}$, in each of which the test mark RM has been transferred under different exposure conditions, i.e., different focus position or exposure dose amount from those of adjacent divided areas.

After that, the wafer $W_T$ is unloaded, and after the development thereof, is loaded again onto the substrate table 18 of the exposure apparatus 100.

Next, the images of the matrix arrangements of divided areas $DA_{i,j}$ of the plural measurement areas DBn in each shot area on the wafer $W_T$ after the development are picked up, and pattern matching with the predetermined template pattern data is performed on the image datum of each divided area $DA_{i,j}$ (steps 231 through 235 and 253 of FIG. 6).

In this embodiment, because the reference pattern FR is thicker in line width than the measurement pattern PR, even when the exposure dose amount (exposure energy amount) is large enough that the measurement pattern PR's image PW does not appear (overdose), the reference pattern FR's image appears. Further, because the positional relationship between the measurement pattern PR and the reference pattern FR is known, the image datum of each divided area $DA_{i,j}$ on the wafer $W_T$ can be easily matched with the template pattern data through comparing data of the reference pattern's image FW in each image datum and data of the reference pattern's image in the template pattern data as a reference, by which the degree of matching (correlation between the two patterns) can be obtained for each divided area $DA_{i,j}$, and the time required for pattern matching is shortened. In this case, because of using pattern matching, which is objective and quantitative, and not viewing, which is subjective, the forming state of the pattern in each divided area can be accurately obtained.

And based on results of the pattern matching for divided areas, which are objective and quantitative, the best value of the focus position (the best focus position), one of the exposure conditions under consideration, is determined (steps 237 through 249 of FIG. 6).

Therefore, according to this embodiment's method of determining exposure conditions, the best focus position (exposure condition) can be obtained stably, accurately, and quickly without making the test exposure conditions vary too finely.

Further, because of selecting from the image data the image datum (white pattern datum) of a divided area where no measurement pattern's image substantially exists as the template pattern data, this embodiment can detect the boundary between the measurement pattern's transferred image existing and not existing, by using simple processing, accurately enough for practical use. Further, in this case, since the threshold value can be set to be high, false recognition hardly occurs, thus achieving ideal pattern detection. Note that not being limited to that, the template pattern data may be pattern data calculated from the measurement pattern and the projection magnification of the projection optical system PL.

Still further, this embodiment's method of determining exposure conditions, after matching the image datum of each divided area $DA_{i,j}$ with the template pattern data to obtain a correlation coefficient (the degree of matching), compares the correlation coefficients and the predetermined threshold value as a reference for obtaining a approximate curve on the two-dimensional coordinate system whose axes represent the exposure dose amount and the best focus position, and obtains boundary points from results of the comparing and then an approximate curve fitting close to the boundary points (steps 237 through 247 of FIG. 6). And the best focus position is obtained from an extreme value (peak or bottom) of the approximate curve calculated (step 249 of FIG. 6). It is noted that the best focus position, etc., may be obtained from an inflection point or intersections with a threshold level of the approximate curve depending on the order of the approximate curve.

As described above, according to this embodiment's method of determining exposure conditions, because of calculating an approximate curve by the function fitting, which method is objective and certain, and then the best focus position by the simple operation, the best focus position, one of the best exposure conditions, can be determined stably, accurately, and certainly.

Yet further, according to the exposure method of this embodiment, since the target focus position in exposure is set taking into account the best focus position determined in the above-mentioned way, color unevenness due to defocus can be prevented from occurring, so that a fine dimension pattern can be accurately transferred onto a wafer.

While in the above embodiment the measurement pattern PR on the reticle $R_T$ is a line-and-space pattern having a line-and-space duty ratio of no greater than 1/3, the present invention is not limited to this, needless to say. The reason why in the above embodiment a line-and-space pattern having a line-and-space duty ratio of 1/4 is used is that, if the measurement pattern is an isolated line, the intensity of a signal obtained is too low. Therefore, if a signal of enough intensity is obtained, the measurement pattern may include a usual line-and-space pattern having a line-and-space duty ratio of 1, a periodic pattern of contact holes, an isolated line, or a single contact hole. A line-and-space pattern having any duty ratio can be used as the measurement pattern, and when the duty ratio is small, it can be seen substantially as an isolated line.

As in the above embodiment, in the case of performing pattern matching with a white pattern datum as the template pattern data, even when the measurement pattern is an isolated line having a line width that is about the minimum line width of the today's exposure apparatus, the best focus position can be detected accurately enough.

<<A Second Embodiment>>

A second embodiment of the present invention will be described below with reference to FIGS. 13 to 15 and FIGS. 5 and 7. The exposure apparatus of the second embodiment is the same in construction as the exposure apparatus 100 of the first embodiment and partly different in the control algorism executed in determining the best exposure conditions from that of the first embodiment. A description will be provided below centered on the difference, and the same reference numerals or symbols as in the first embodiment denote the same or like components.

Figure 13:
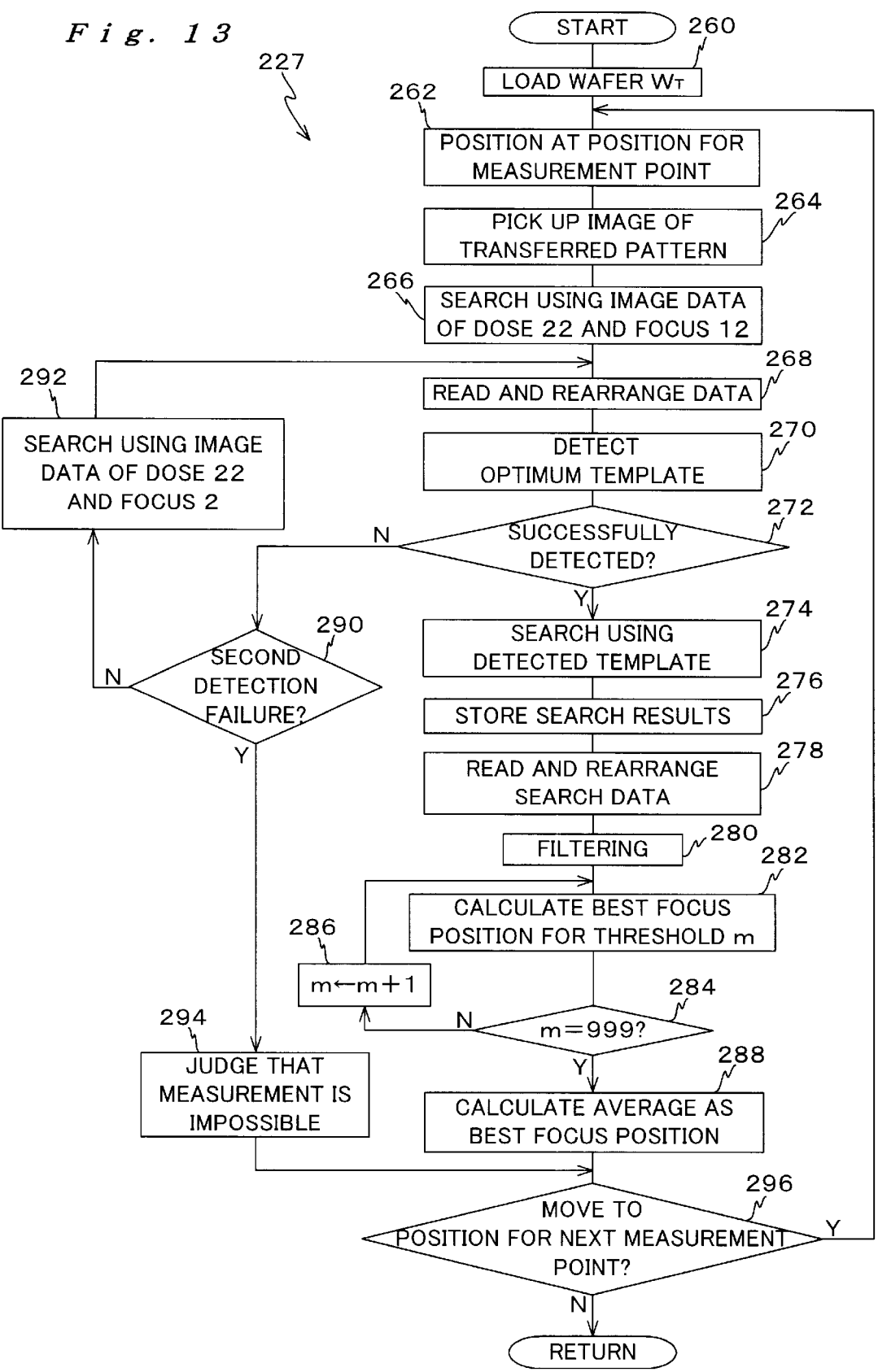
FIG. 13 is a flow chart showing the process of subroutine 227 of FIG. 5 in a second embodiment of this invention.

Also in the second embodiment, the control algorism of the main routine is exactly the same as that represented by the flow chart of FIG. 5 and only subroutine 227 is different. FIG. 13 shows the flow chart of the control algorism of the second embodiment for determining the best exposure conditions and executed by CPU of the main controller 20.

As a premise, a test reticle $R_T$ used in this embodiment has five test marks RM (see FIG. 4A) formed in five areas, the center and four corners, of its pattern area PA as shown in FIG. 7, and the lines' arrangement period of the measurement pattern is equal to 2LR. That is, the measurement pattern on the test reticle $R_T$ is a L/S pattern having a duty ratio of 1/2. The pattern area PA except the five areas for the test marks RM is opaque to the exposure light.

It is when CPU of the main controller 20 is notified by the control system of the coater-developer of the completion of the development of a wafer $W_T$ in step 225 of FIG. 5 that the process of the subroutine of FIG. 13 starts, as mentioned above.

First, in step 260 of the subroutine 227 of FIG. 13, according to instructions to load the wafer $W_T$ developed, a wafer transport system (not shown) loads the wafer $W_T$ onto the substrate table 18 like above. After the loading of the wafer $W_T$, the EGA type of wafer alignment is performed using the alignment detecting system ALG like above.

In next step 262, the wafer $W_T$ is positioned at such a position that the alignment detecting system ALG can detect the first measurement area DB1 in a first shot area on the wafer $W_T$, based on results of the wafer alignment like above.

In next step 264, the alignment detecting system ALG picks up an image of the resist images formed in divided areas $DA_{i,j}$ of the first measurement area DB1 in the first shot area, and the image data is taken in. Although images of the resist images formed in all of M×N divided areas $DA_{i,j}$ of the measurement area DB1 are picked up at one time here, for example if it is necessary to improve the resolution in the image datum of each divided area, the image data of individual divided areas may be taken in by repeating stepping the substrate table 18 two-dimensionally on the X-Y plane by a predetermined distance and then picking up the image of a different divided area's resist image with a larger magnification by the alignment detecting system ALG.

In next step 266 a search is performed using as template pattern data the image data of specific, first divided area $DA_{12,22}$ selected from the divided areas $DA_{i,j}$ and where no measurement pattern's resist image substantially exists (corresponding to template 1 of the first embodiment), in the same way as in step 235 of the first embodiment, and the search results, i.e. the binary numeral results, are stored in the predetermined area of RAM in such a way as to be able to identify them with respective divided areas $DA_{i,j}$.

Figure 14:
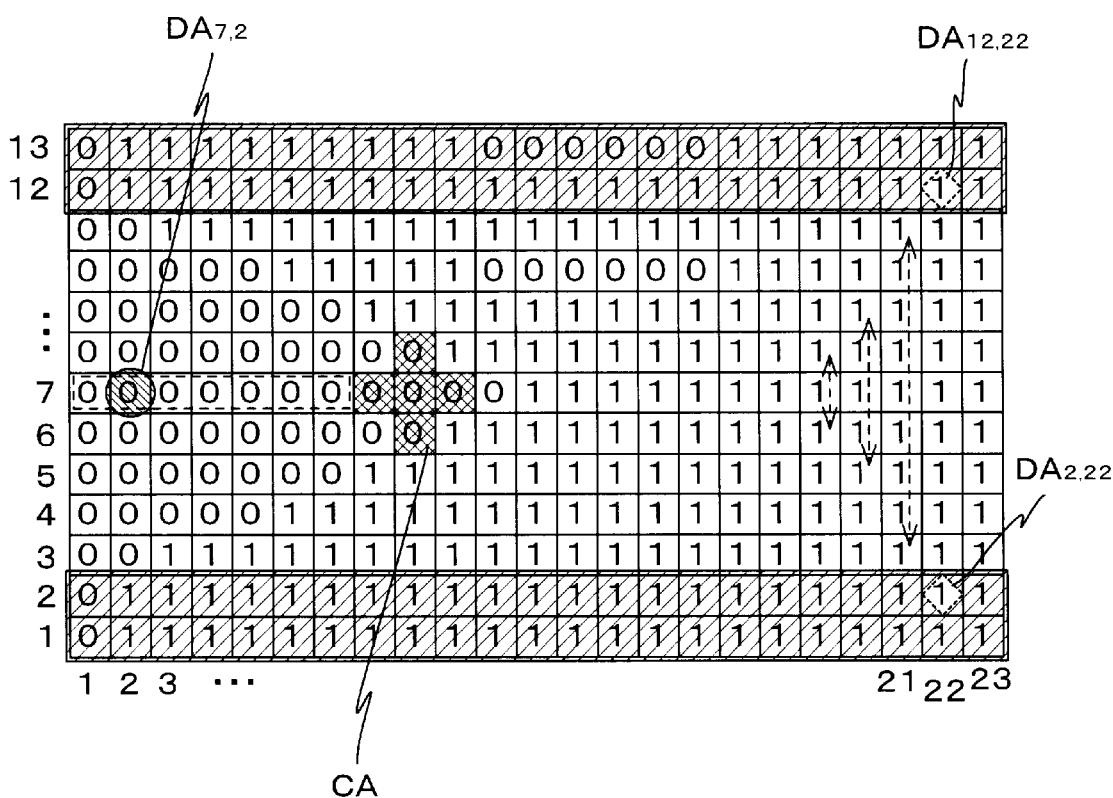
FIG. 14 is a view showing in the form of a table an example of binary numeral data, search results, rearranged in the order in which divided areas are arranged.
Figure 15:
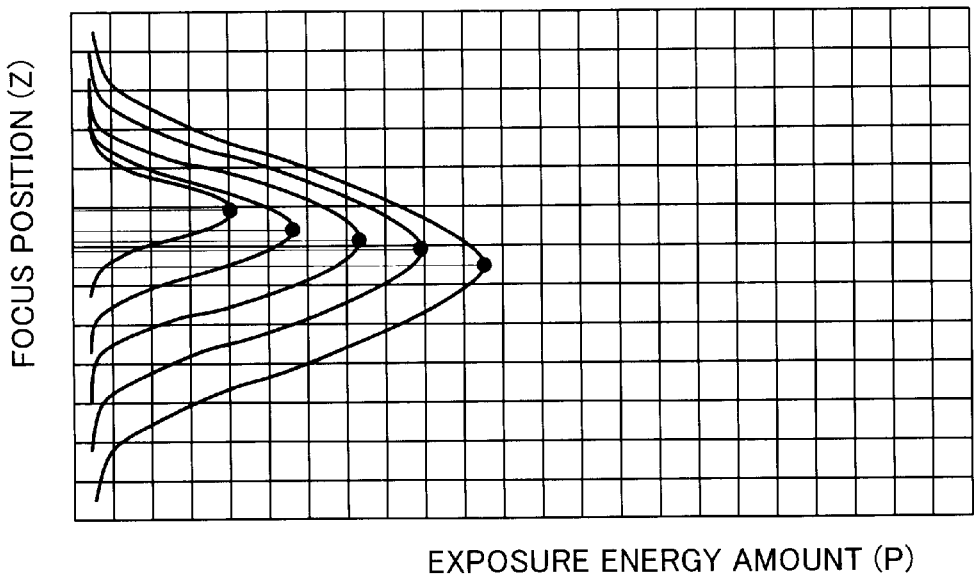
FIG. 15 is a simplified view showing how focus positions $Z_m$ are sequentially calculated which correspond to the vertexes of multiple mountain-like shapes for threshold values m.

Next step 268 reads and rearranges the search results, i.e. the binary numerals, in the order in which the divided areas are arranged. FIG. 14 shows an example of the rearranged binary numeral results in the form of a table.

Next step 270 detects an optimum divided area $DA_{i,j}$ in terms of using as the template, from the rearranged binary numerals.

That is, as shown in for example FIG. 14, respective two focus positions in each end of the focus position range are set as portions not to be evaluated, and while moving a cross-shaped detection window CA as shown in FIG. 14 sequentially in the direction in which the dose amount decreases, the average of data from the cross-shaped detection window CA is obtained for each position in order to determine whether or not the measurement pattern's transferred image exists.

In this way, a focus row including the peak of a mountain-like shape formed by divided areas where the measurement pattern's transferred image exists is identified, and it is ascertained whether or not in that focus row an enough number of divided areas exist, that is, the peak has enough height. If it is ascertained that in that focus row an enough number of divided areas exist, the image datum of the divided area that is second smallest in dose amount in the focus row is adopted as the template pattern data. FIG. 14 shows an example where it is ascertained that in focus row 7 an enough number of divided areas exist and where the image datum of divided area $DA_{7,2}$ is designated as the template pattern data.

Meanwhile, a focus row including the peak of a mountain-like shape formed by divided areas where the measurement pattern's transferred image exists is identified, and if it is ascertained that in that focus row an enough number of divided areas do not exist, it is judged that the detection has failed.

After the above process of step 270, next step 272 checks whether or not an optimum divided area $DA_{i,j}$ as the template has been successfully detected, and if the answer is YES, the process proceeds to step 274.

In step 274, a search using the detected template pattern data is performed in the following manner.

That is, the correlation coefficient $C_{i,j}$ of each divided area $DA_{i,j}$ is obtained by pattern-matching the image datum of the pattern transferred on the divided area $DA_{i,j}$ with the template pattern data, which, when the frame-like features are coincident with each other in comparing the image datum of the transferred image FW of the reference pattern FR in the template pattern data and the image datum of the transferred image FW of the reference pattern FR in each divided area $DA_{i,j}$, calculates the correlation coefficient $C_{i,j}$ thereof, considering that the image datum of the divided area $DA_{i,j}$ has been detected. The correlation coefficients $C_{i,j}$ are normalized so as to fall in the range of 0 through 1000.

Next, step 276 stores the search results, i.e. the correlation coefficients $C_{i,j}$ of the divided areas $DA_{i,j}$, in a predetermined area of RAM in such a way as to be able to identify them with respective divided areas $DA_{i,j}$.

Next step 278 reads and rearranges the search results, i.e. the correlation coefficients $C_{i,j}$ of the divided areas $DA_{i,j}$, in the order in which the divided areas are arranged, and the process proceeds to step 280, which performs filter processing for reducing the effect of jump areas due to the above-mentioned causes. The filter processing is to calculate the average of data of 3×3 divided areas whose center is a divided area to be evaluated.

Next step 282 calculates the best focus position $Z_m$ for threshold value m, which is initially set equal to for example 500. Here, a shape formed by divided areas $DA_{i,j}$ whose $C_{i,j}$ is equal to or greater than threshold value m is identified on the coordinate system whose Y-axis and X-axis represent the best focus position and the exposure dose amount respectively, and the best focus position $Z_m$ for threshold value m is determined as a focus position (Z) corresponding to the peak of the shape, which is usually shaped like a mountain.

Next step 284 checks whether or not threshold value m is equal to 999, and if the answer to the check is NO, the process proceeds to step 286, where m is increased by, e.g., 1. Then, the process returns to step 282, and the sequence of steps 282, 284, and 286 is repeated until the answer to the check in step 284 becomes YES, by which the peaks of mountain-like shapes and the best focus positions $Z_m$, for many threshold values m are calculated sequentially as shown schematically in FIG. 15.

It is noted that in step 282 the best focus position for threshold value m may be determined as the average of the Z-positions of two intersections with an appropriate slice level (exposure amount P) of the mountain-like shape.

And when threshold value m becomes equal to 999, and the answer to the check in step 284 is YES, the process proceeds to step 288, which computes the average $(\Sigma Z_m/500)$ of 500 best focus positions $Z_m$ obtained for threshold values m of 500 through 999, and stores the average as a best focus position $Z_{best}$, a best exposure condition, in the area of RAM for storing results. Then, step 296 is taken. Instead of the simple average in step 288, identifying a range of threshold value m in which best focus positions $Z_m$ hardly vary with threshold value m or vary within a predetermined range and which range is equal to or longer than a predetermined length ($m_a \leq m \leq m_b$), the best focus position $Z_{best}$ may be determined as the average or weighted average of best focus positions $Z_m$ over the range ($m_a \leq m \leq m_b$).

Step 296 determines whether or not to move to a next measurement area, by checking whether or not template matching for determining the best exposure conditions has been completed for all measurement areas in all shot areas on the wafer $W_T$ to be measured. If the answer is YES, the process returns to step 262, after which the above sequence is repeated.

Meanwhile, if the answer to the check in step 272 is NO, the process proceeds to step 290, which checks whether or not it is a second detection failure, and if the answer to this check is NO, that is, if it is a first detection failure, step 292 is taken where a search is performed using as template pattern data the image data of specific, second divided area $DA_{2,22}$ selected from the divided areas $DA_{i,j}$ and where no measurement pattern's image substantially exists (corresponding to template 2 of the first embodiment), in the same way as in step 235 of the first embodiment, and the search results, i.e. the binary numeral results, are stored in the predetermined area of RAM in such a way as to be able to identify them with respective divided areas $DA_{i,j}$.

After that, the process returns to step 268, and the above sequence from step 268 is repeated.

Meanwhile, if the answer to the check in step 290 is YES, the process proceeds to step 294, which stores the judgment that the measurement is impossible as information in the area of RAM for storing results, and step 296 is taken.

After, in this way, for all measurement areas in all shot areas on the wafer $W_T$ to be measured, the best exposure conditions are determined or the judgment that the measurement is impossible is made, the answer in step 296 is NO, and the process proceeds to step 229 in the main routine of FIG. 5.

And step 229 of FIG. 5 stores the data stored in step 227 in the area of RAM for storing results, i.e. data of the best focus positions calculated in step 288 or the judgment that the measurement is impossible made in step 294 in the hard disk 29, displays it on the screen of a display unit (not shown), and ends the process of the present routine.

After that, for example an operator, based on the results displayed in step 229, calculates the average of the calculated best focus positions of each measurement area DBn's instances in the plurality of shot areas as the best focus position for the measurement area DBn, that is, for a corresponding measurement point. Further, the field curvature of the projection optical system PL can be calculated based on the best focus positions calculated for the five measurement points. Needless to say, the main controller 20 may be programmed to automatically calculate the best focus positions and the field curvature.

Also in the second embodiment, since the target focus position in exposure is set taking into account the best focus position determined in the above-mentioned way, color unevenness due to defocus can be prevented from occurring, so that a fine dimension pattern can be accurately transferred onto a wafer.

As described above, according to the second embodiment's method of determining exposure conditions, after pattern-matching the image datum of each divided area $DA_{i,j}$ on the wafer $W_T$, where a resist image of a test mark RM on the reticle $R_T$ is formed, with the template pattern data (here, black pattern data) to obtain the correlation coefficient (the degree of matching), a curve is obtained by comparing the correlation coefficients and each of a plurality of preset, different threshold values as a reference for identifying a curve on the two-dimensional coordinate system whose axes represent the best focus position and the exposure dose amount on the image plane, and from the curves, the best focus position is detected for the corresponding measurement area DBn (steps 274 through 288 of FIG. 13).

Therefore, according to the second embodiment's method of determining exposure conditions, the best exposure condition under consideration (the best focus position) can be obtained stably, accurately, and quickly without making the test exposure conditions vary too finely like in the first embodiment.

Further, the second embodiment automatically detects the optimum template pattern data for each measurement point. That is, it selects from the image data of the divided areas $DA_{i,j}$ on the wafer $W_T$, in each of which a test mark RM of the reticle $R_T$ has been transferred, the image datum (white pattern datum) of a divided area where no measurement pattern's image substantially exists as the template pattern data, and performs pattern matching with the template pattern data to detect the boundary between the measurement pattern's transferred image existing and not existing (steps 266 through 270 of FIG. 13). And based on the boundary curve obtained from the results, it certainly detects divided areas having a high possibility that a measurement pattern's well-resolved image exists therein, and selects from the divided areas a divided area satisfying a certain criterion, whose image datum is then used as a template pattern. In this way the template pattern satisfying desired conditions certainly is selected. This automatic detection of the template pattern improves the accuracy and enables the consecutive measurement of wafers exposed under different conditions.

As seen from the above, in the exposure apparatus of the above embodiments, the main controller 20 determines exposure conditions in the above manner according to the program of determining exposure conditions already installed in the hard disk 29, thereby achieving determining automatically exposure conditions for the exposure apparatus. Needless to say, the program of determining exposure conditions stored in another information storage medium such as CD-ROM, optical disk, MO, etc., may be then installed in the hard disk 29.

As seen from the above, a control algorism can be adopted which alternatively selects one of subroutines 227 of FIGS. 6 and 13 in the first and second embodiments based on a preset criterion that can be the type of measurement pattern on the test reticle $R_T$, for example whether or not the line-and-space duty ratio is greater than a preset threshold value. It can be achieved by making a simple modification to the program.

In the second embodiment, it may be that a curve is obtained based on results of comparing the correlation coefficients and a preset threshold value and that based on the curve the best focus position is determined like in the first embodiment. In this case, from an approximate curve fitted close to the obtained curve, the best focus position may be determined like in the first embodiment.

In the first embodiment, a curve may be obtained by comparing the correlation coefficients and each of a plurality of preset, different threshold values as a reference for identifying a curve on the two-dimensional coordinate system whose axes represent the best focus position and the exposure dose amount on the image plane, and from the curves. In this case, based on the curve for each threshold value a best focus position is detected for the threshold value, and the average of the best focus positions is determined to be a real best focus position, or alternatively, instead of the simple average, identifying a range of threshold value m in which best focus positions hardly vary with threshold value m or vary within a predetermined range and which range is not shorter than a predetermined length, a real best focus position may be determined as the average or weighted average of the best focus positions over the range.

Figure 16:
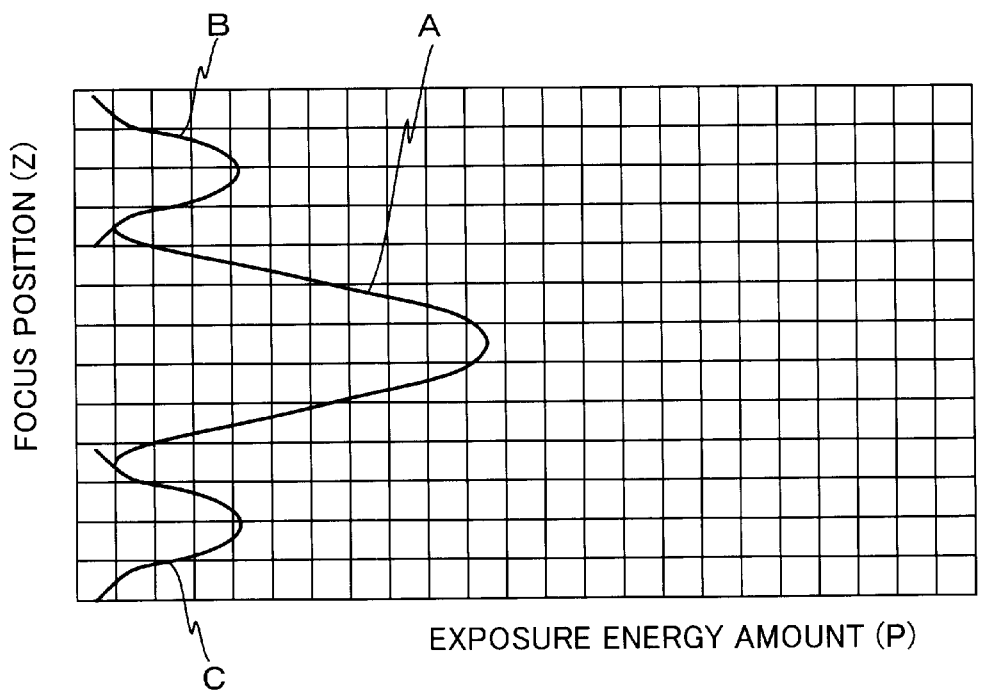
FIG. 16 is a view showing an example of the shape including a plurality of mountain-like shapes (including false resolution shapes)

When performing the same process as in the above embodiments, a shape formed by divided areas whose the correlation coefficients are above a threshold value may have several peaks as shown in FIG. 16, the shape including falsely-resolved image portions. In such a case, the best focus position may be calculated based on only a mountain-like shape A in the center, but the control algorism is preferably one that calculates the best focus position based on mountain-like shapes B and C having a lower peak in the upper and lower ends of FIG. 16 as well without ignoring the falsely-resolved image portions, which contain necessary information. For example, the best focus position may be determined as the average of the focus position corresponding to the peak of mountain-like figure A and the average of the focus positions corresponding to the peaks of mountain-like figures B and C.

Figure 17A:
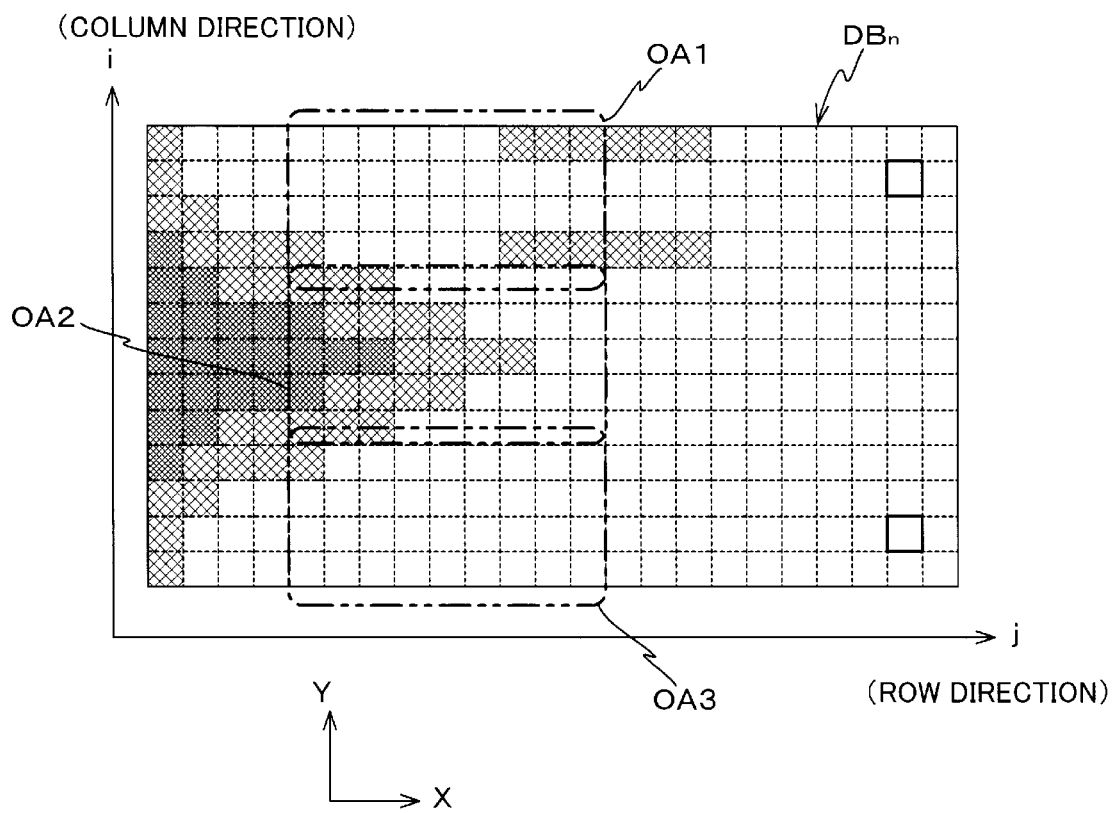
FIG. 17A is a view for explaining another example of the method of picking up an image of a measurement area on a wafer W that can be used in the first and second embodiments.

Although, in the above embodiments, the alignment detecting system ALG picks up the image of the whole measurement area DBn at one time, or individually the images of the divided areas $DA_{i,j}$, in the former case the resolution of the image may not be sufficient, and in the latter case it may take a long time to acquire the image data. In this case, as shown in for example FIG. 17A only the images of portions of the measurement area DBn may be selectively picked up in which a mountain-like curve is expected from experience to exist in the relationship between the focus position and the number of residual patterns. FIG. 17A shows an example where the images of three portions (OA1, OA2, OA3) are selectively picked up, but it is not limited to this. According to that, the time needed for acquiring the image data and processing it can be shortened compared with the case of picking up the image of the whole measurement area DBn, and the resolution and accuracy in measurement by the alignment detecting system ALG can be improved.

Figure 17B:
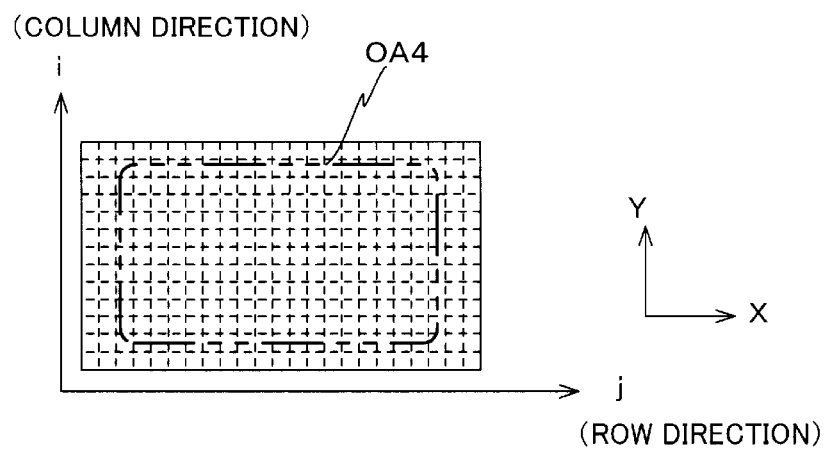
FIG. 17B is a view for explaining an example of the method of picking up an image of a measurement area when the test exposure pattern is shrunk.

In this case, when the size of the measurement area shrinks by, e.g., a factor of ¼ by shrinking the size of a test exposure pattern or measurement pattern as shown in for example FIG. 17B, picking up the image of one selected area OA4 gives image data needed for image-processing without the decrease of resolution, and the time needed for acquiring the image data and processing it can be further shortened. In any case, dispersion (3σ) in the measurement results can be reduced compared with the conventional method using the viewing.

Although the above embodiments describe the case where after transferring the patterns of the test marks RM onto divided areas $DA_{i,j}$ on the wafer $W_T$, and the alignment detecting system ALG of the FIA type picks up the images of the resist images formed on the divided areas $DA_{i,j}$ of the wafer $W_T$ after development to perform template-matching on the image data, the present invention's method of determining exposure conditions is not limited to this. For example the alignment detecting system ALG may be the type of alignment detecting system that scans a laser beam across divided areas to detect a reflected or scattered beam or that directs a coherent beam almost perpendicularly to a divided area and detects the interference of same diffraction order of sub-beams from the mark in the divided area (the ± first order, the ± second order, to the ± n'th order of diffracted sub-beams). In this case, the interference of each diffraction order may be detected to use the detection result for at least one of the diffraction orders, or it may direct a plurality of coherent beams having different wavelengths to a divided area and detect the interference of each diffraction order of sub-beams for each wavelength. Also in these cases, after sequentially transferring the test exposure patterns onto a plurality of divided areas on a wafer through the projection optical system PL, the alignment detecting system picking up the images of the test exposure patterns' resist images formed on the divided areas of the wafer after development gives pattern-formation information thereof, which is, in the former, intensity signals of the reflected or scattered beams or signals obtained by processing the intensity signals and, in the latter, phase information or information obtained by processing it. Other types of detection give information of the kind corresponding to the type. In these cases, the reference pattern as the indicator for pattern matching is not needed, and the test exposure pattern can be one including only the measurement pattern.

And like in the second embodiment, after comparing pattern-formation information of the divided areas and a plurality of preset, different threshold values as a reference for calculating the best exposure condition under consideration and identifying a range of threshold values in which best exposure conditions hardly vary with the threshold value or vary within a predetermined range and which range is not shorter than a predetermined length, a real best exposure condition is determined based on best exposure conditions for the range. In this way, the real best exposure condition can be determined easily and certainly, preventing the difficulty in determining a threshold value.

In the above embodiments, instead of the resist images, the images of latent images in the resist after exposure for example may be picked up, and a pickup unit exclusively for that use may be provided outside the exposure apparatus.

Although the above embodiments describe the case where the reticle $R_T$ on which the frame-like feature FR is formed as a reference pattern is used for test exposure, not being limited to this, various features can be used as the reference pattern, which needs to serve as a position reference for the measurement pattern and be thick enough, for example, that its resist image formed on a wafer $W_T$ through development can be seen. That is, the thickness of the reference pattern needs to be decided such that its resist image remains on the wafer through the process, taking into account the characteristics of the resist and exposure conditions.

Furthermore, since the image datum of each divided area taken in may be one rotated with respect to the original datum in the two-dimensional coordinate system, the reference pattern is preferably one that indicates the orientation of the measurement pattern's transferred image. In this case, if the orientation of transferred images on the wafer is rotated with respect to the standard orientation, the image data of the transferred images can be readily matched with template pattern data. Needless to say, the reference pattern may be one that indicates the magnification as well as the orientation of the measurement pattern's image.

Although the above embodiments describe the case where exposure conditions under consideration that are changed for each transfer of patterns are the position in the projection optical system's optical axis direction of a wafer $W_T$ (the focus position) and the energy amount of the energy beam irradiating the wafer $W_T$ (the exposure dose amount), the present invention is not limited to this. For example, exposure conditions under consideration may be any of illumination conditions (including the type of mask) and setting conditions for all components related to exposure such as the imaging characteristics of the projection optical system. Further, two kinds of exposure conditions are not necessarily changed during exposure. That is, if while changing only one kind of exposure condition, e.g. the focus position or the exposure dose amount, the patterns on a measurement mask are transferred onto a plurality of fields on an object to perform template matching on the image data of the transferred images, the existence of the reference pattern enables the quick execution of the matching.

Furthermore, the number of exposure conditions under consideration for which the best ones are to be determined is not limited to one. For example, in the above embodiments, in the case of determining the best exposure dose amount as well as the best focus position, having set some additional dose steps under the above-mentioned range, the same process as in the above may be performed to determine the best exposure dose amount as a dose step at which the focus position range where pattern's images consecutively exist is largest with the curve obtained.

Moreover, fields onto which a measurement pattern is transferred on a substrate (object) need not necessarily be arranged in a matrix as described above. This is because pattern matching can be performed on data of the patterns' images wherever they are formed on the substrate.

Meanwhile, in the case of fields arranged in a matrix as in the above embodiments, a reference pattern need not necessarily be provided on the measurement mask. This is because template matching can be performed on image data produced by picking up the image of the whole matrix arrangement at one time.

While the above embodiments describe the case of using a measurement reticle $R_T$ having five test marks RM formed in five areas, the center and four corners, of its pattern area PA, not being limited to this, test marks RM may be formed at positions on the measurement reticle $R_T$ according to position resolution desired in terms of determining the best exposure conditions.

While in the above embodiments the pattern formed on the measurement reticle $R_T$ is an L/S pattern having lines arranged in one direction, it may be a compound L/S pattern where longitudinal lines, lateral lines, oblique lines, etc., are formed close to each other. In this case, aberrations such as astigmatism can be measured. Further, when the measurement pattern is a periodic pattern, it may be a pattern where for example dot marks are arranged periodically and not a line-and-space pattern.

Although in the above embodiments pattern matching with a template pattern which produces a correlation coefficient is used, pattern matching which calculates the difference between patterns may be used. In this case, in the best exposure conditions, the difference, the pattern matching result, is minimal, and as exposure conditions move away from the best exposure conditions, the pattern matching result becomes larger. Taking into account this point, the best exposure conditions can be determined like in the above embodiments.

Further, the light source of the exposure apparatus of the above embodiments is a laser light source, but can be a super-high pressure mercury lamp emitting a bright line in the ultraviolet range such as a g-line or i-line. In this case, exposure energy is adjusted by lamp output control, an attenuation filter such as an ND filter, a light quantity diaphragm, or the like.

In addition, the present invention can be applied to any exposure apparatus for manufacturing devices or liquid crystal displays such as a reduction-projection exposure apparatus using ultraviolet light or soft X-rays having a wavelength of about 10 nm as the light source, an X-ray exposure apparatus using light having a wavelength of about 1 nm, and an exposure apparatus using EB (electron beam) or an ion beam, regardless of whether it is of a step-and-repeat type, a step-and-scan type, or a step-and-stitching type.

For example, in the case of a scanning exposure apparatus, an illumination area shaped like a rectangular or arc-like slit that extends in the non-scan direction is formed, and by setting measurement points in the image field of the projection optical system corresponding to the illumination area, the best exposure conditions, e.g. the best exposure dose amount and the best focus position, and the imaging-characteristics of the projection optical system PL such as field curvature can be determined or measured like in the above embodiments. In the case of a scanning exposure apparatus using a pulse light source, the exposure dose amount (the exposure energy amount or integral exposure amount) on the image plane can be adjusted to a desired value by adjusting at least one of the energy amount per pulse on the image plane from the pulse light source, the pulse repetition frequency, the illumination area's width in the scan direction (so-called slit width), and the scan speed.

In the case of exposure while scanning a reticle and a wafer in the scan direction, for example, the Y-direction, the best focus positions in scanning the wafer in the +Y direction and in scanning the wafer in the −Y direction are not necessary the same, in which case the multi-focus-position detection system (40, 42) need be offset differently. Therefore, for scanning exposure apparatuses, both the best focus positions in scanning the wafer in the +Y direction and in scanning the wafer in the −Y direction are preferably measured.

<<A Device Manufacturing Method>>

Next, the manufacture of devices by using the above exposure apparatus and method will be described.

Figure 18:
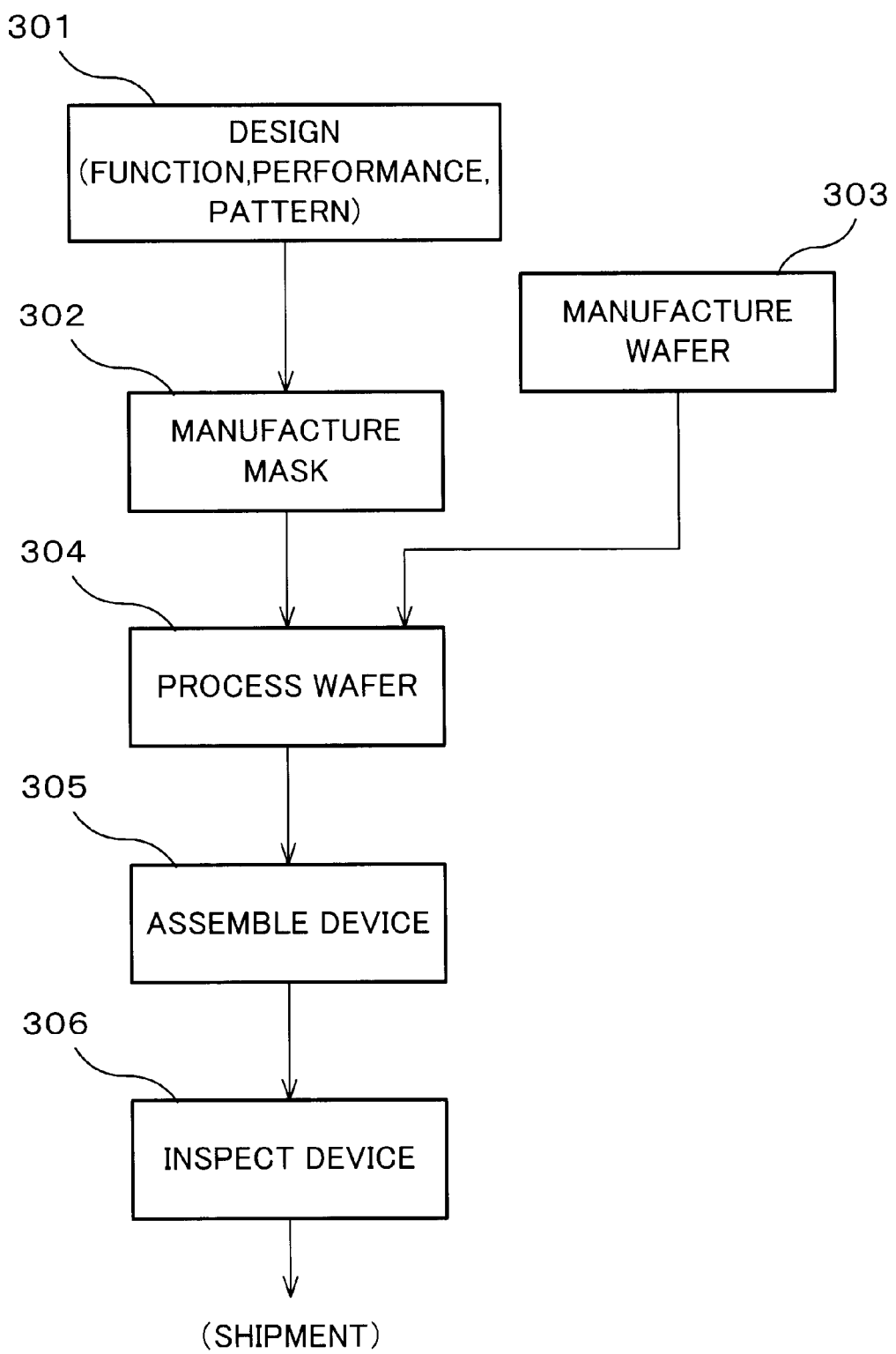
FIG. 18 is a flow chart for explaining an embodiment of the device manufacturing method of this invention.

FIG. 18 is a flow chart for the manufacture of devices (semiconductor chips such as ICs or LSIs, liquid crystal panels, CCD's, thin magnetic heads, micro machines, or the like) in this embodiment. As shown in FIG. 18, in step 301 (design step), function/performance design for the devices (e.g., circuit design for semiconductor devices) is performed and pattern design is performed to implement the function. In step 302 (mask manufacturing step), masks on which a different sub-pattern of the designed circuit is formed are produced. In step 303 (wafer manufacturing step), wafers are manufactured by using silicon material or the like.

In step 304 (wafer-processing step), actual circuits and the like are formed on the wafers by lithography or the like using the masks and the wafers prepared in steps 301 through 303, as will be described later. In step 305 (device assembly step), the devices are assembled from the wafers processed in step 304. Step 305 includes processes such as dicing, bonding, and packaging (chip encapsulation).

Finally, in step 306 (inspection step), an operation test, durability test, and the like are performed on the devices. After these steps, the process ends and the devices are shipped out.

Figure 19:
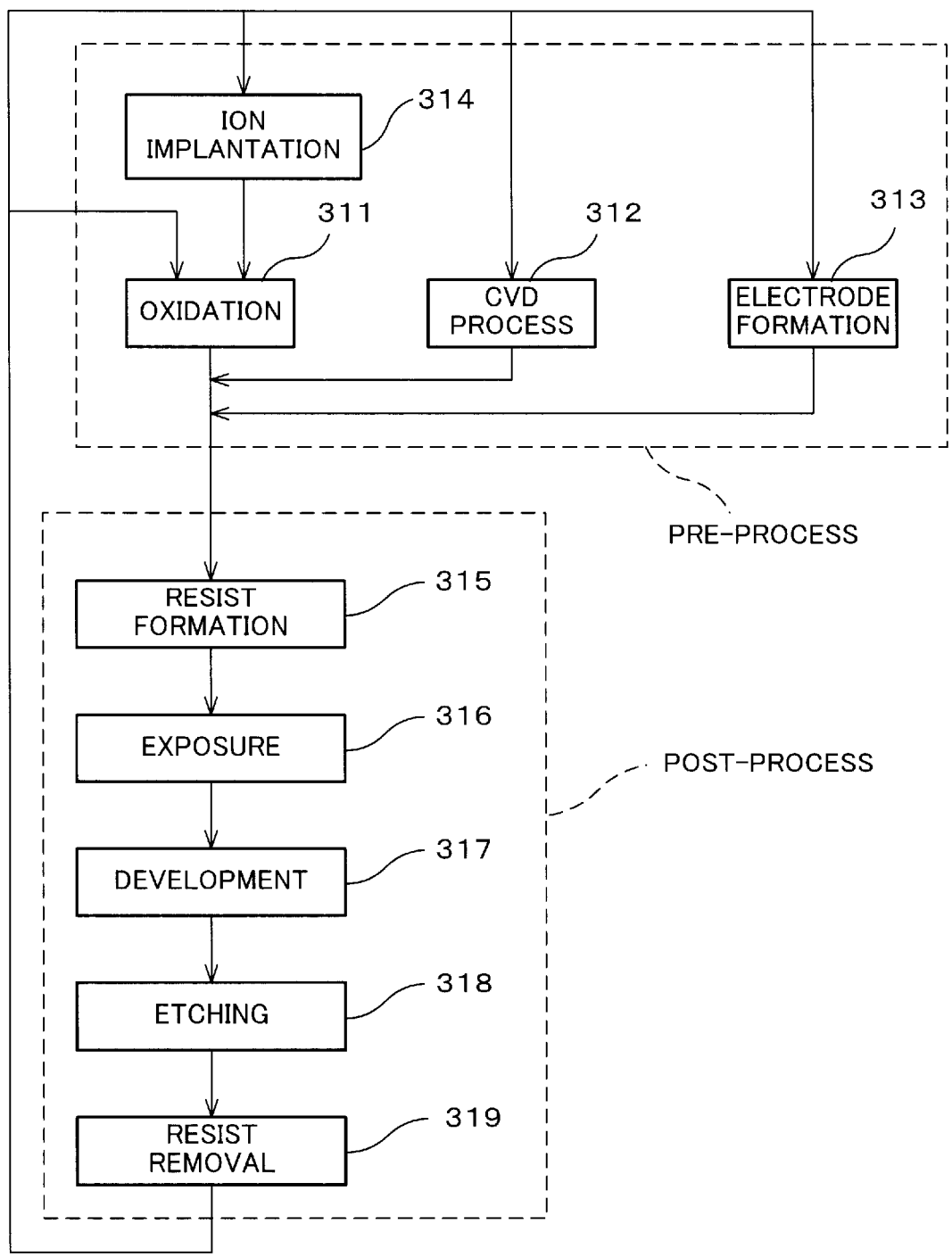
FIG. 19 is a flow chart showing the process of the step 304 in FIG. 18.

FIG. 19 is a flow chart showing a detailed example of step 304 described above in manufacturing semiconductor devices. Referring to FIG. 19, in step 311 (oxidation step), the surface of a wafer is oxidized. In step 312 (CVD step), an insulating film is formed on the wafer surface. In step 313 (electrode formation step), electrodes are formed on the wafer by vapor deposition. In step 314 (ion implantation step), ions are implanted into the wafer. Steps 311 through 314 described above constitute a pre-process, which is repeated, in the wafer-processing step and are selectively executed in accordance with the processing required in each repetition.

When the above pre-process is completed in each repetition in the wafer-processing step, a post-process is executed in the following manner. First of all, in step 315 (resist coating step), the wafer is coated with a photosensitive material (resist). In step 316, the above exposure apparatus transfers a sub-pattern of the circuit on a mask onto the wafer according to the above method. In step 317 (development step), the exposed wafer is developed. In step 318 (etching step), an uncovered member of portions other than portions on which the resist is left is removed by etching. In step 319 (resist removing step), the unnecessary resist after the etching is removed.

By repeatedly performing the pre-process and post-process, a multiple-layer circuit pattern is formed on each shot-area of the wafer.

According to the device manufacturing method of this embodiment described above, because in the exposure step the exposure apparatus and method of either of the above embodiments is used, accurate exposure is performed under the best exposure conditions determined using the method of determining exposure conditions, so that highly-integrated devices can be manufactured.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure condition determining method with which to determine exposure conditions for transferring a pattern arranged on a first plane onto an object arranged on a second plane via a projection optical system, said method comprising:

transferring a test exposure pattern including a predetermined measurement pattern and a reference pattern sequentially onto a plurality of part areas on said object via said projection optical system while changing at least one of exposure conditions under consideration, said reference pattern being formed on said object having a photosensitive layer on its surface to be thicker in line width than said measurement pattern;

picking up an image of said plurality of part areas on said object on each of which said test exposure pattern has been transferred under the exposure conditions of different values and performing pattern-matching with predetermined template pattern data on the image datum of each part area, said template pattern data including image data corresponding to said reference pattern; and determining said at least one exposure condition under consideration based on results of said pattern-matching for said part areas.

2. An exposure condition determining method according to claim 1, wherein in said transferring, said transfer is performed while changing two exposure conditions under consideration, wherein in said picking-up and performing, a respective correlation value between said template pattern data and the image datum of each said part area is obtained as a result of said pattern-matching, and wherein in said determining, at least one of said exposure conditions under consideration is determined based on a curve shape identified based on results of comparing said correlation values and a preset threshold value as a reference for identifying said curve shape on a two-dimensional coordinate system whose axes represent said two exposure conditions under consideration respectively.

3. An exposure condition determining method according to claim 2, wherein said curve shape is an approximate curve.

4. An exposure condition determining method according to claim 2, wherein said plurality of part areas on said object are arranged in a matrix on said object so as to form a rectangular area as a whole,
  wherein said curve shape is a shape including a mountain-like curve appearing in said rectangular area, and
  wherein when picking up an image of said plurality of part areas, an image of part of said rectangular area is picked up, in which part a mountain-like curve is, from experience, expected to exist.

5. An exposure condition determining method according to claim 4, wherein an image of each of a plurality of divided areas that said target area whose image to be picked up is divided into is picked up.

6. An exposure condition determining method according to claim 1, wherein said template pattern data is image data of at least one part area where an image of said measurement pattern does not substantially exist and which is selected from image data of said plurality of part areas on said object on which said test exposure pattern has been transferred in said transferring.

7. An exposure condition determining method according to claim 1, wherein said template pattern data is image data of at least one part area having a high possibility that a transferred, best-resolved image of said measurement pattern exists and which is selected from image data of said plurality of part areas on said object on which said test exposure pattern has been transferred in said transferring.

8. An exposure condition determining method according to claim 7, further comprising:
  performing, before said determining, pattern-matching on the image datum of each part area with using as template pattern data image data of at least one part area where an image of said measurement pattern does not substantially exist and which is selected from image data of said plurality of part areas on said object on which said test exposure pattern has been transferred in said transferring.

9. An exposure condition determining method according to claim 1, wherein a target for said picking-up is a latent image formed in said photosensitive layer.

10. An exposure condition determining method according to claim 1, wherein said photosensitive layer is made of a photo-resist, and a target for said picking-up is a resist image obtained by developing said object.

11. An exposure condition determining method according to claim 10, wherein said reference pattern has such a thickness that said resist image formed on said object through said development does not disappear.

12. An exposure condition determining method according to claim 1, wherein said reference pattern is such that the orientation of a transferred image of said measurement pattern can be detected from.

13. An exposure condition determining method according to claim 12, wherein said reference pattern is a frame-like pattern arranged around said measurement pattern and which is thick in line width.

14. An exposure condition determining method according to claim 1, wherein said reference pattern is such that the magnifying/reducing ratio of a transferred image of said measurement pattern can be detected from.

15. An exposure condition determining method according to claim 1, wherein said exposure conditions under consideration include at least one of position of said object in the optical axis direction of said projection optical system and the energy amount of an energy beam irradiating said object.

16. An exposure condition determining method according to claim 1, wherein said measurement pattern includes either of a line-and-space pattern having a duty ratio of 1/n, where n is not equal to zero, and a periodic pattern of contact holes.

17. An exposure condition determining method according to claim 1, wherein said measurement pattern includes either of an isolated line and an isolated contact hole.

18. An exposure condition determining method with which to determine exposure conditions for transferring a pattern arranged on a first plane onto an object arranged on a second plane via a projection optical system, said method comprising:
  transferring a measurement pattern sequentially onto a plurality of part areas on an object having a photosensitive layer on the surface thereof via said projection optical system while changing two exposure conditions under consideration;
  picking up an image of said plurality of part areas on said object on each of which said measurement pattern has been transferred under the exposure conditions of different values and selecting as a template pattern datum image data of at least one part area where an image of said measurement pattern does not substantially exist from the picked-up image data of said plurality of part areas;
  pattern-matching the image datum of each said part area with at least said selected template pattern datum to obtain a respective correlation value, and comparing said correlation values and a preset threshold value as a reference for calculating an approximate curve on a two-dimensional coordinate system whose axes represent said two exposure conditions under consideration respectively; and
  determining at least one of said exposure conditions under consideration based on an approximate curve calculated based on results of said comparing.

19. An exposure condition determining method according to claim 18, wherein said threshold value is determined based on a distribution of correlation values obtained beforehand by pattern-matching.

20. An exposure condition determining method according to claim 19, wherein said distribution of correlation values is a distribution obtained by normalizing correlation values of said part areas obtained by said pattern-matching.

21. An exposure condition determining method according to claim 18, wherein in said picking up and selecting, image data of at least two part areas satisfying said condition each are selected as said template datum, and
  wherein when, in performing said pattern-matching and comparing with using one of said selected template data, an approximate curve cannot be calculated, said pattern-matching and comparing is performed again using at least one of the rest of said selected template data.

22. An exposure condition determining method according to claim 18, wherein a target for said picking-up is a latent image formed in said photosensitive layer.

23. An exposure condition determining method according to claim 18, wherein said photosensitive layer is made of a photo-resist, and a target for said picking-up is a resist image obtained by developing said object.

24. An exposure condition determining method according to claim 18, wherein said exposure conditions under consideration include at least one of position of said object in the optical axis direction of said projection optical system and the energy amount of an energy beam irradiating said object.

25. An exposure condition determining method according to claim 18, wherein said measurement pattern includes either of a line-and-space pattern having a duty ratio of 1/n, where n is not equal to zero, and a periodic pattern of contact holes.

26. An exposure condition determining method according to claim 18, wherein said measurement pattern includes either of an isolated line and an isolated contact hole.

27. An exposure condition determining method with which to determine exposure conditions for transferring a pattern arranged on a first plane onto an object arranged on a second plane via a projection optical system, said method comprising:

transferring a measurement pattern sequentially onto a plurality of part areas on an object having a photosensitive layer on the surface thereof via said projection optical system while changing two exposure conditions under consideration;

picking up an image of said plurality of part areas on said object on each of which said measurement pattern has been transferred under the exposure conditions of different values and selecting as first template pattern data image data of at least one part area having a high possibility that a transferred, best-resolved image of said measurement pattern exists from the picked-up image data of said plurality of part areas;

pattern-matching the image datum of each said part area with said selected first template pattern data to obtain a respective correlation value, and comparing said correlation values and a preset threshold value as a reference for calculating a curve shape on a two-dimensional coordinate system whose axes represent said two exposure conditions under consideration respectively; and determining at least one of said exposure conditions under consideration based on said curve shape calculated.

28. An exposure condition determining method according to claim 27, wherein said plurality of part areas on said object are arranged in a matrix on said object so as to form a rectangular area as a whole, wherein said curve shape is a shape including a mountain-like curve appearing in said rectangular area, and wherein when picking up an image of said plurality of part areas, an image of part of said rectangular area is picked up, in which part a mountain-like curve is, from experience, expected to exist.

29. An exposure condition determining method according to claim 28, wherein an image of each of a plurality of divided areas that said target area whose image to be picked up is divided into is picked up.

30. An exposure condition determining method according to claim 27, further comprising:

selecting, before said picking up and selecting, as second template pattern data image data of at least one part area where an image of said measurement pattern does not substantially exist from image data of said plurality of part areas; and pattern-matching the image datum of each said part area with at least said selected second template pattern data to obtain a respective correlation value, and comparing said correlation values and a preset threshold value as a reference for calculating a curve shape on a two-dimensional coordinate system whose axes represent said two exposure conditions under consideration respectively, and wherein in said selecting of image data as first template pattern data, image data of at least one part area where a transferred, best-resolved image of said measurement pattern is expected to exist based on said curve shape obtained in said pattern-matching with at least said selected second template pattern data is selected as said first template pattern data.

31. An exposure condition determining method according to claim 30, wherein said plurality of part areas on said object are arranged in a matrix on said object so as to form a rectangular area as a whole, wherein the selecting of said second template pattern data is based on results of judging for part areas whether or not a transferred image of said measurement pattern exists in each of the part areas by obtaining the average of data in a predetermined detection window at each movement position, while sequentially moving said detection window in at least part of said rectangular area.

32. An exposure condition determining method according to claim 27, wherein in said pattern-matching and comparing, comparing said correlation values with a different one of a plurality of threshold values is repeated, and said curve shape is calculated for each threshold value, and wherein in said determining, at least one of said exposure conditions under consideration is determined based on at least two of said curve shapes each calculated for said respective threshold value.

33. An exposure condition determining method according to claim 27, wherein said exposure conditions under consideration include at least one of position of said object in the optical axis direction of said projection optical system and the energy amount of an energy beam irradiating said object.

34. An exposure condition determining method according to claim 27, wherein a target for said picking-up is a latent image formed in said photosensitive layer.

35. An exposure condition determining method according to claim 27, wherein said photosensitive layer is made of a photo-resist, and a target for said picking-up is a resist image obtained by developing said object.

36. An exposure condition determining method according to claim 27, wherein said measurement pattern includes either of a line-and-space pattern having a duty ratio of 1/n, where n is not equal to zero, and a periodic pattern of contact holes.

37. An exposure condition determining method according to claim 27, wherein said measurement pattern includes either of an isolated line and an isolated contact hole.

38. An exposure condition determining method with which to determine exposure conditions for transferring a pattern arranged on a first plane onto an object arranged on a second plane via a projection optical system, said method comprising:

transferring a measurement pattern sequentially onto a plurality of part areas on an object having a photosensitive layer on the surface thereof via said projection optical system while changing at least one of exposure conditions under consideration;

acquiring a piece of information about the formation state of the pattern in each of said plurality of part areas on said object on each of which said measurement pattern has been transferred under the exposure conditions of different values; and comparing repeatedly said pieces of information about the formation states of the patterns in said part areas obtained in said acquiring, with a different one of a plurality of preset threshold values as references for calculating said one of the exposure conditions, and detecting a range of the threshold values in which values of said one of the exposure conditions under consideration calculated based on respective threshold values vary within a predetermined range and which range is continuous and not shorter than a predetermined length, and determining a best exposure condition based on the values for the threshold value range of said one of the exposure conditions under consideration.

39. An exposure condition determining method according to claim 38, wherein in said acquiring, an image datum as a result of picking up each of said plurality of part areas on said object is pattern-matched with a predetermined template pattern data to obtain a respective correlation value, and wherein in said comparing and detecting, comparing said correlation values and a different one of said threshold values is repeated.

40. An exposure condition determining method according to claim 39, wherein a target for said picking-up is a latent image formed in said photosensitive layer.

41. An exposure condition determining method according to claim 39, wherein said photosensitive layer is made of a photo-resist, and a target for said picking-up is a resist image obtained by developing said object.

42. An exposure condition determining method according to claim 38, wherein in said comparing and detecting, one of the average and weighted average of values of said one of the exposure conditions under consideration over said detected range is determined to be a best exposure condition.

43. An exposure method with which to transfer a pattern formed on a mask onto a substrate via a projection optical system by an exposure energy beam irradiating said mask, said exposure method comprising:

setting exposure conditions for exposure, taking into account exposure conditions under consideration determined according to the exposure condition determining method of claim 1; and transferring the pattern formed on said mask onto said substrate via said projection optical system under said set exposure conditions.

44. An exposure method with which to transfer a pattern formed on a mask onto a substrate via a projection optical system by an exposure energy beam irradiating said mask, said exposure method comprising:

setting exposure conditions for exposure, taking into account exposure conditions under consideration determined according to the exposure condition determining method of claim 18; and transferring the pattern formed on said mask onto said substrate via said projection optical system under said set exposure conditions.

45. An exposure method with which to transfer a pattern formed on a mask onto a substrate via a projection optical system by an exposure energy beam irradiating said mask, said exposure method comprising:

setting exposure conditions for exposure, taking into account exposure conditions under consideration determined according to the exposure condition determining method of claim 27; and transferring the pattern formed on said mask onto said substrate via said projection optical system under said set exposure conditions.

46. An exposure method with which to transfer a pattern formed on a mask onto a substrate via a projection optical system by an exposure energy beam irradiating said mask, said exposure method comprising:

setting exposure conditions for exposure, taking into account exposure conditions under consideration determined according to the exposure condition determining method of claim 38; and transferring the pattern formed on said mask onto said substrate via said projection optical system under said set exposure conditions.

47. A device manufacturing method including a lithography process, wherein in said lithography process, the exposure method of claim 43 is used.

48. A device manufacturing method including a lithography process, wherein in said lithography process, the exposure method of claim 44 is used.

49. A device manufacturing method including a lithography process, wherein in said lithography process, the exposure method of claim 45 is used.

50. A device manufacturing method including a lithography process, wherein in said lithography process, the exposure method of claim 46 is used.

51. A program which makes a computer determine exposure conditions for an exposure apparatus transferring a mask pattern onto a substrate via a projection optical system, said program making said computer execute the procedures of:

transferring a measurement pattern sequentially onto a plurality of part areas on an object having a photosensitive layer on its surface via said projection optical system while changing at least one of exposure conditions under consideration;

picking up an image of the respective images transferred on said plurality of part areas on said object each under the exposure condition of different values and performing pattern-matching with predetermined template pattern data on the respective image data of said part areas; and determining said at least one exposure condition under consideration based on results of said pattern-matching.

52. A storage medium which stores the program according to claim 48 and can be read by a computer.

* * * * *